(12) United States Patent
Kim

(10) Patent No.: US 11,217,540 B2
(45) Date of Patent: Jan. 4, 2022

(54) SEMICONDUCTOR PACKAGE INCLUDING NONCONDUCTIVE FILM HAVING CONTROLLED TAIL PORTION

(71) Applicant: SK hynix Inc., Icheon-si (KR)

(72) Inventor: Sung Su Kim, Hwaseong-si (KR)

(73) Assignee: SK hynix Inc., Gyeonggi-do (KR)

( * ) Notice: Subject to any disclaimer, the term of this patent is extended or adjusted under 35 U.S.C. 154(b) by 24 days.

(21) Appl. No.: 16/915,031

(22) Filed: Jun. 29, 2020

(65) Prior Publication Data

US 2021/0159190 A1 May 27, 2021

(30) Foreign Application Priority Data

Nov. 21, 2019 (KR) .......................... 10-2019-0150812

(51) Int. Cl.
*H01L 23/00* (2006.01)
*H01L 25/065* (2006.01)
*H01L 25/00* (2006.01)

(52) U.S. Cl.
CPC ........ *H01L 23/562* (2013.01); *H01L 25/0657* (2013.01); *H01L 25/50* (2013.01); *H01L 2225/06513* (2013.01); *H01L 2225/06541* (2013.01); *H01L 2225/06582* (2013.01)

(58) Field of Classification Search
CPC ..... H01L 2924/181; H01L 2924/00012; H01L 21/563; H01L 2224/13025
See application file for complete search history.

(56) References Cited

U.S. PATENT DOCUMENTS

| | | | |
|---|---|---|---|
| 9,209,133 B2 * | 12/2015 | Kim | H01L 23/564 |
| 9,324,688 B2 * | 4/2016 | Sung | H01L 25/0652 |
| 9,455,230 B1 * | 9/2016 | Park | H01L 23/4985 |
| 9,536,846 B2 * | 1/2017 | Park | H01L 24/11 |
| 11,056,432 B2 * | 7/2021 | Lee | H01L 23/367 |
| 2018/0350779 A1 | 12/2018 | Choi et al. | |
| 2019/0043823 A1 | 2/2019 | Venkatadri et al. | |

* cited by examiner

*Primary Examiner* — Thao P Le
(74) *Attorney, Agent, or Firm* — William Park & Associates Ltd.

(57) ABSTRACT

A semiconductor package according to an aspect includes a package substrate, a first semiconductor chip disposed on the package substrate and including a first through electrode, a second semiconductor chip stacked on the first semiconductor chip and having a second through electrode, and a nonconductive film disposed in a bonding zone between the first semiconductor chip and the second semiconductor chip. At an edge portion of the bonding zone, an edge portion of the first semiconductor chip is recessed in the lateral direction, based on an edge portion of the second semiconductor chip.

20 Claims, 17 Drawing Sheets

SEMICONDUCTOR PACKAGE INCLUDING NONCONDUCTIVE FILM HAVING CONTROLLED TAIL PORTION

CROSS-REFERENCE TO RELATED APPLICATION

The present application claims priority under 35 U.S.C 119(a) to Korean Patent Application No. 10-2019-0150812, filed on Nov. 21, 2019, which is herein incorporated by reference in its entirety.

BACKGROUND

1. Technical Field

The present disclosure relates generally to a semiconductor package and, more particularly, to a semiconductor package including a nonconductive film having a controlled tail portion.

2. Related Art

Recently, semiconductor packages have been developed to achieve high performance and large capacity along with miniaturization and thinning. In order to realize the high performance and the large capacity, a structure in which a plurality of semiconductor chips are stacked on a package substrate has been proposed.

As an example, in a structure in which the plurality of semiconductor chips are electrically connected to each other by a flip chip bonding method, regions around bumps to which different semiconductor chips are bonded may be filled with various materials for structural stability. As a filling method, for example, there is an underfill method of injecting a filling material into spaces between the different semiconductor chips, a method of filling the spaces between the different semiconductor chips by bonding a semiconductor chip coated with a non-conductive paste or a nonconductive film to another semiconductor chip, and the like.

SUMMARY

A semiconductor package according to an aspect of the present disclosure may include a package substrate, a first semiconductor chip disposed on the package substrate and including a first through electrode, a second semiconductor chip stacked on the first semiconductor chip and having a second through electrode, and a nonconductive film disposed in a bonding zone between the first semiconductor chip and the second semiconductor chip. At an edge portion of the bonding zone in a lateral direction, an edge portion of the first semiconductor chip may be recessed in the lateral direction, based on an edge portion of the second semiconductor chip.

A semiconductor package according to another aspect of the present disclosure may include a package substrate, a first semiconductor chip disposed on the package substrate and having a first through electrode, a second semiconductor chip stacked on the first semiconductor chip and having a second through electrode, and a nonconductive film disposed in a bonding zone between the first semiconductor chip and the second semiconductor chip. In the semiconductor package, the first semiconductor chip may have a hollow portion formed in an inner direction of the first semiconductor chip from a first bonding surface in contact with the nonconductive film, in an edge portion of the bonding zone. The first bonding surface may be an interface between the first semiconductor chip and the nonconductive film in a center portion of the bonding zone.

A semiconductor package according to another aspect of the present disclosure may include a package substrate, semiconductor chips of the same type stacked on the package substrate to overlap each other in a vertical direction, and a nonconductive film disposed in a bonding zone between the stacked semiconductor chips. Each of the semiconductor chips may have a hollow portion formed in an inner direction of the semiconductor chips from an upper surface of each of the semiconductor chips, in an edge portion of the bonding zone.

DETAILED DESCRIPTION

Figure 1:
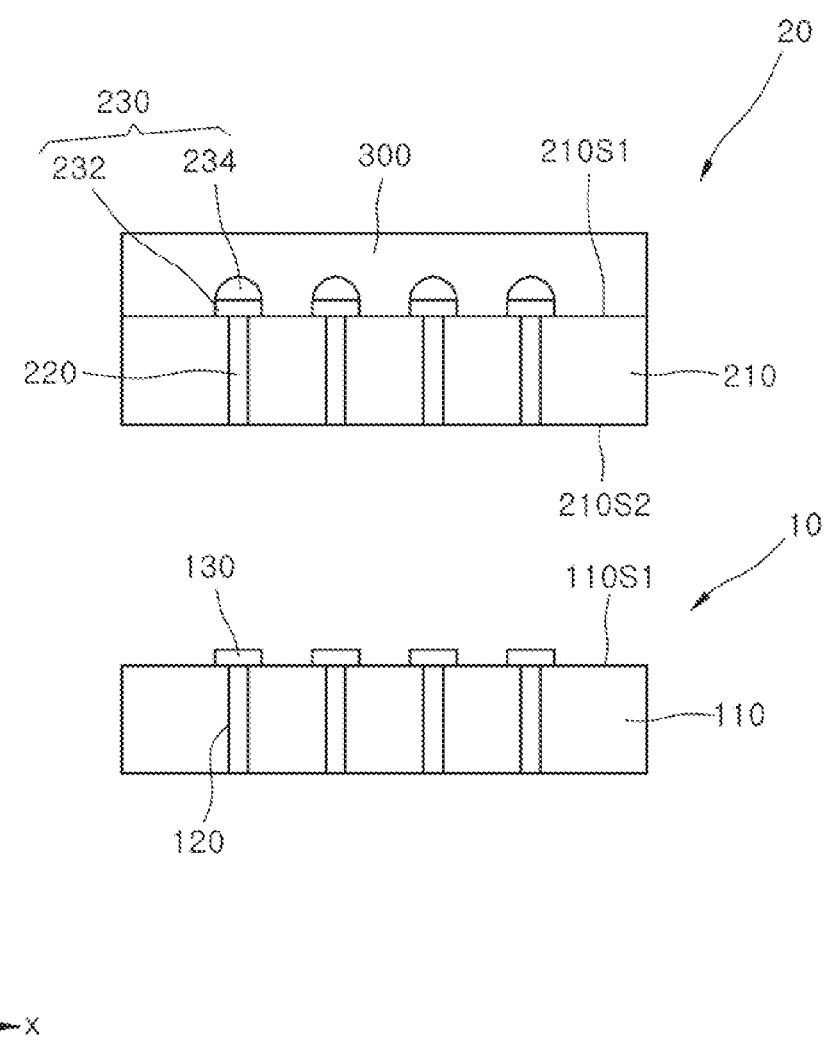
FIGS. 1, 2, and 3 are views schematically illustrating a method of stacking semiconductor chips of a comparative example in manufacturing a semiconductor package.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence. It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Same reference numerals may refer to same elements throughout the specification. The same or similar reference numerals may be described with reference to other drawings even if they are not mentioned or described in the corresponding drawings. Also, although reference numerals are not indicated, they may be described with reference to other drawings.

Embodiments of the present disclosure provide a technique of controlling the shape of a tail portion of a nonconductive film generated in a bonding process in a semiconductor package having a plurality of semiconductor chips bonded by the nonconductive film.

A semiconductor package according to an embodiment of the present disclosure includes a first semiconductor chip disposed on a package substrate and including a first through electrode, a second semiconductor chip stacked on the first semiconductor chip and including a second through electrode, and a nonconductive film disposed in a bonding zone between the first and second semiconductor chips. Here, by controlling the structures of the first semiconductor chip and the second semiconductor chip adjacent to the lateral edge portion of the bonding zone of the first semiconductor chip and the second semiconductor chip, the shape of the tail portion of the nonconductive film formed outside the bonding zone can be effectively controlled. Through this, the structural stability of the semiconductor package including the first and second semiconductor chips and the nonconductive film can be improved.

In the specification of the present disclosure, the bonding zone refers to a region overlapping in the vertical direction when a package substrate and a semiconductor chip are bonded, or a region overlapping in the vertical direction when a first semiconductor chip and a second semiconductor chip are bonded.

Figure 2:
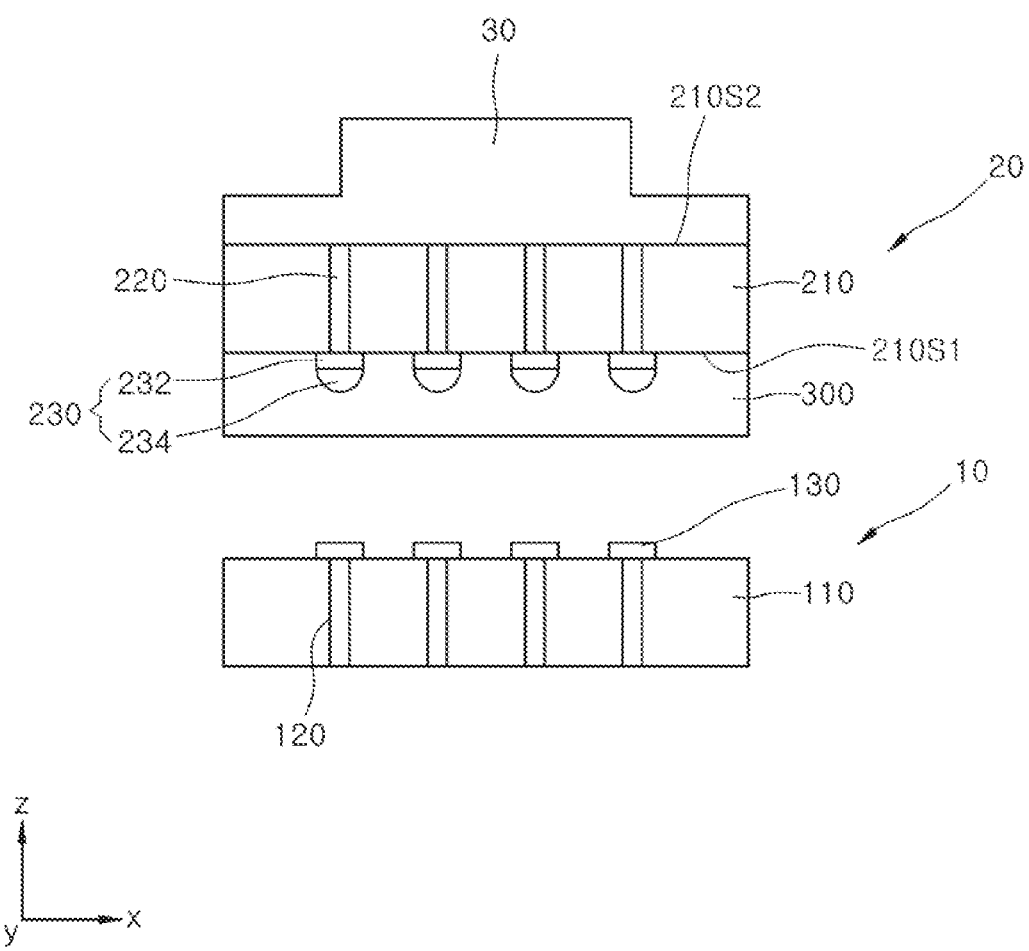
Figure 3:
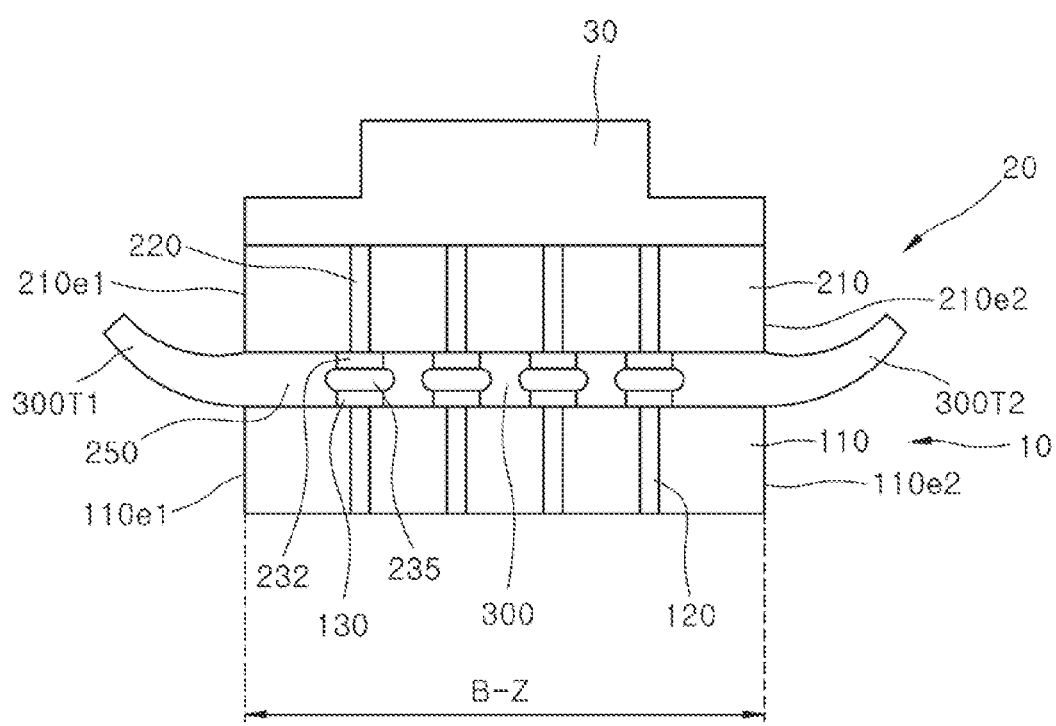

FIGS. 1, 2, and 3 are views schematically illustrating a method of stacking semiconductor chips of a comparative example in manufacturing a semiconductor package. A configuration of the semiconductor chip of the comparative example described with reference to FIGS. 1, 2, and 3 may be different from configurations of semiconductor chips of embodiments described below with reference to FIGS. 6A, 7A, 8A, 9A, and 10A, and FIGS. 6B, 7B, 8B, 9B, and 10B.

Referring to FIG. 1, first and second semiconductor chips 10 and 20 are prepared. The first and second semiconductor chips 10 and 20 may be the same type of chips. That is, the first and second semiconductor chips 10 and 20 may be chips having the same size and the same shape.

The first semiconductor chip 10 has a first chip body portion 110. The first chip body portion 110 may include a plurality of integrated circuits therein. For example, the first chip body portion may include a plurality of active devices and passive devices. As an example, the first chip body portion 110 may include a plurality of circuit pattern layers and a plurality of insulating layers electrically insulating the circuit pattern layers. In addition, the first semiconductor chip 10 includes through electrodes 120 disposed inside the first chip body portion 110 and first bumps 130 disposed on an upper surface 110S1 of the first chip body portion 110. The through electrodes 120 may be electrically connected to the first bumps 130.

Likewise, the second semiconductor chip 20 has a second chip body portion 210. The second semiconductor chip 20 includes through electrodes 220 disposed inside the second chip body portion and second bumps 230 disposed on an upper surface 210S1 of the first chip body portion 210. The second bump 230 may each include a bump supporting portion 232 and a solder material portion 234. The through electrodes 220 may be electrically connected to the second bumps 230.

A nonconductive film 300 is formed on the upper surface 210S1 of the second chip body portion 210 to cover the second bumps 230. The nonconductive film 300 may be formed by laminating a separately prepared nonconductive film on the upper surface 210S1 of the second chip body portion 210, for example.

Referring to FIG. 2, after attaching a bonding apparatus 30 on a lower surface 210S2 of the second semiconductor chip 20, the second semiconductor chip 20 is moved onto the first semiconductor chip 10 using the bonding apparatus 30. For example, the second semiconductor chip 20 is positioned over the first semiconductor chip so that the second bumps 230 of the second chip body portion face the first bumps 130 disposed on an upper surface 110S1 of the first chip body portion 110.

Referring to FIG. 3, heat and pressure are applied to the bonding apparatus 30 to bond the second bumps 230 and the first bumps 130 to each other. At this time, the first and second bumps and 230 may be coupled by the solder material portions 234. The solder material portions 234 are converted into solder bonding portions 235 by the applied heat and pressure.

The nonconductive film 300 can bond the first and second semiconductor chips 10 and 20 to each other. That is, the nonconductive film 300 may form a bonding zone B-Z in a region where the first and second semiconductor chips 10 and 20 overlap each other. Meanwhile, due to the heat and pressure applied by the bonding apparatus 30, portions of the nonconductive film 300 may be pushed out of the bonding zone B-Z. Accordingly, tail portions 300T1 and 300T2 of the nonconductive film 300 may be formed outside the bonding zone B-Z. Referring to FIG. 3, a first tail portion 300T1 may be formed outside a first sidewall surface 110e1 of the first chip body portion 110 and a first sidewall surface 210e1 of the second chip body portion 210. In addition, a second tail portion 300T2 may be formed outside a second sidewall surface 110e2 of the first chip body portion 110 and a second sidewall surface 210e2 of the second chip body portion 210. The first sidewall surface 110e1 and the second sidewall surface 110e2 of the first chip body portion may be opposite to each other, and the first sidewall surface 210e1 and the second sidewall surface 210e2 of the second chip body portion 210 may be opposite to each other.

Meanwhile, as described below with reference to FIGS. 4A, 4B, 4C, and 5, the first and second tail portions 300T1 and 300T2 of the nonconductive film 300, extruded to the outside of the bonding zone B-Z may have various shapes according to the heat and pressure applied by the bonding apparatus 30 at the time of bonding the first and second semiconductor chips 10 and 20. As illustrated in FIG. 3, as an example, each of the first and second tail portions 300T1 and 300T2 may have a shape bent in an upper direction of the first semiconductor chip 10, that is, the z-direction.

Figure 4A:
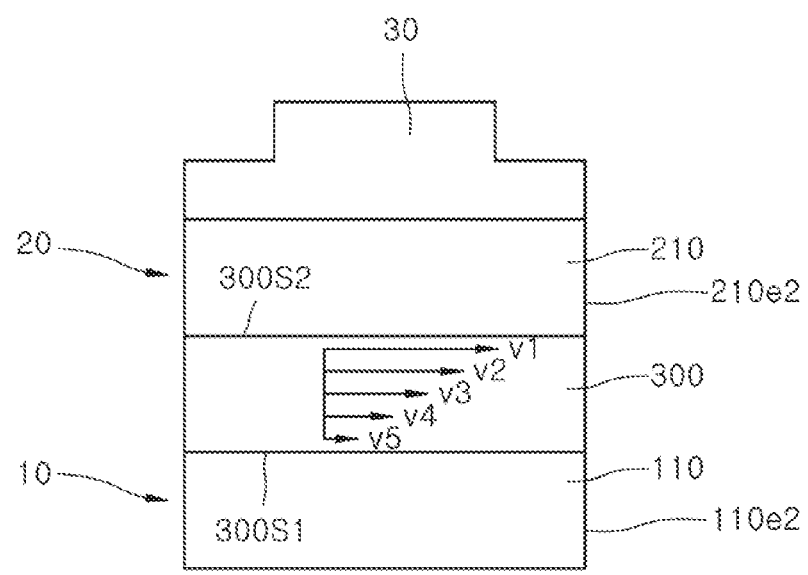
FIGS. 4A, 4B, and 4C are schematic views illustrating a process in which tail portions of a nonconductive film having various shapes are generated when stacking semiconductor chips of a comparative example.
Figure 4B:
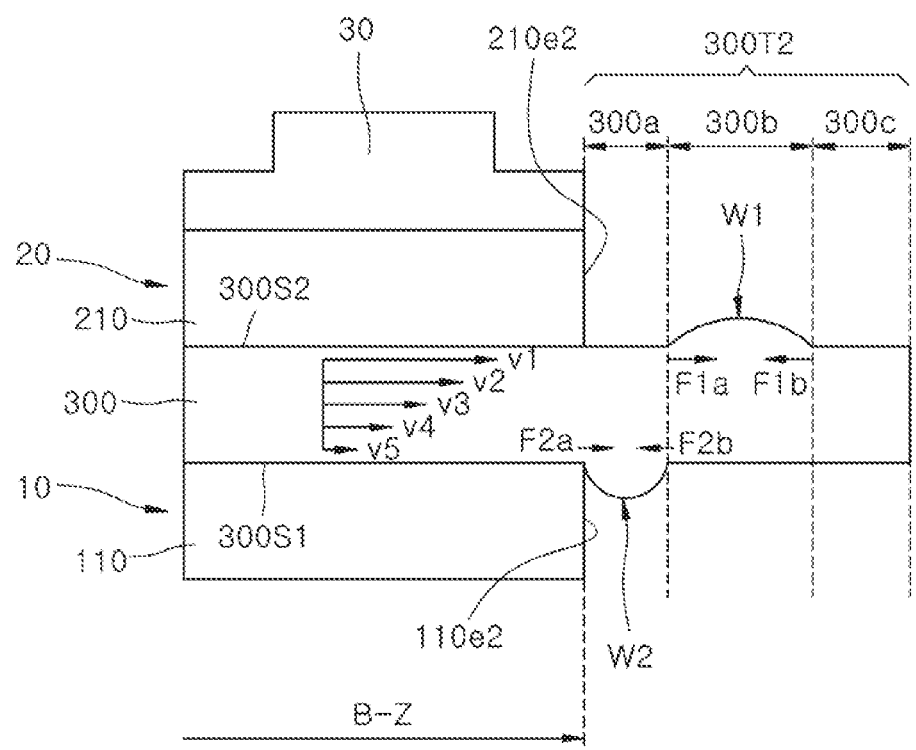
Figure 4C:
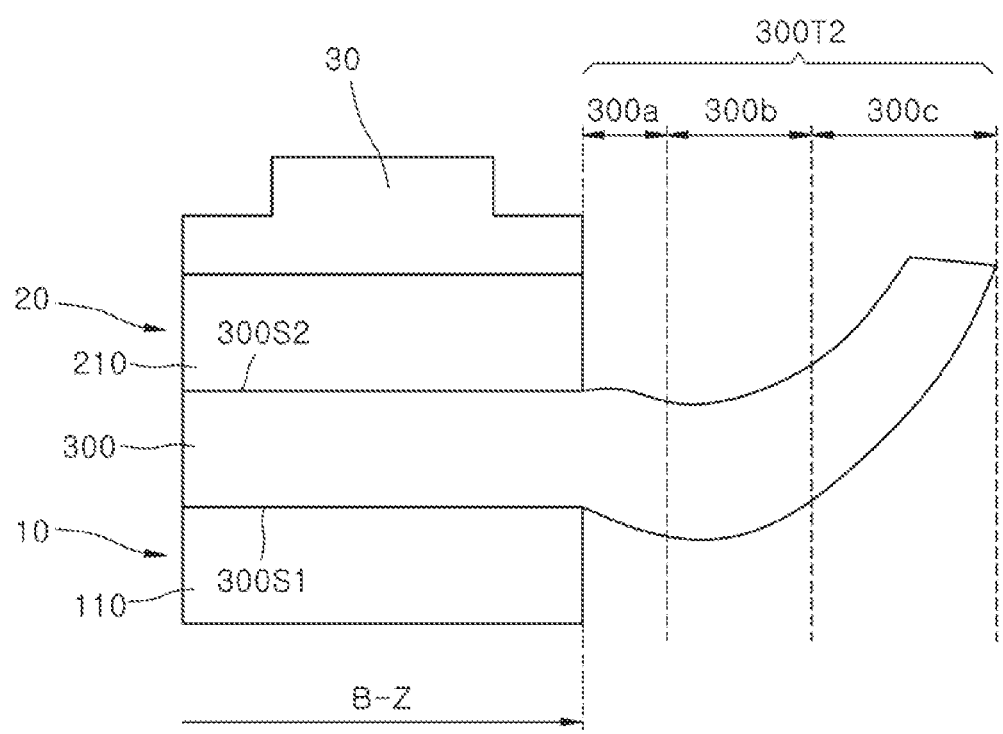

FIGS. 4A, 4B, and 4C are schematic views illustrating a process in which tail portions of a nonconductive film, having various shapes are generated when stacking semiconductor chips of a comparative example. For convenience of description, FIGS. 4A, 4B, and 4C illustrate a change in the nonconductive film 300 which occurs in a region adjacent to the second sidewall surfaces 110e2 and 210e2 of the first and second chip body portions 110 and 210 is enlarged, when the bonding process is performed on the first and second semiconductor chips 10 and 20 described above with reference to FIGS. 1 to 3. Although, it is not illustrated in FIGS. 4A, 4B, and 4C, a change in the nonconductive film 300 which occurs in a region adjacent to the first sidewall surfaces 110e1 and 210e1 of the first and second chip body portions 110 and 210 is substantially the same as the change in the nonconductive film 300 which occurs in the region adjacent to the second sidewall surfaces 110e2 and 210e2. In addition, for convenience of description, the through electrodes disposed in the first and second chip body portions 110 and 210 and the bumps disposed on the first and second chip body portions 110 and 210 are not shown.

Referring to FIG. 4A, after the bonding apparatus 30 heated to a predetermined temperature is attached to the second semiconductor chip 20, the second semiconductor chip 20 may be moved to a corresponding position over the first semiconductor chip 10. Then, the bonding apparatus 30 may apply pressure to the second semiconductor chip 20 to bond to the first semiconductor chip 10. At this time, the second semiconductor chip 20 may be bonded to the first semiconductor chip 10 while being heated by the bonding apparatus 30. The heat and pressure applied to the second semiconductor chip 20 from the bonding apparatus 30 may be transferred to the nonconductive film 300, and a temperature gradient may occur in the nonconductive film 300 along the thickness direction, that is, the z-direction. That is, the temperature of the nonconductive film 300 may be increased from a first interface 300S1 of the nonconductive film 300 and the first chip body portion up to a second interface 300S2 of the nonconductive film 300 and the second chip body portion 210. Accordingly, the viscosity of the nonconductive film 300 may be decreased from the first interface 300S1 of the nonconductive film 300 and the first chip body portion up to the second interface 300S2 of the nonconductive film 300 and the second chip body portion 210. That is, the viscosity of the nonconductive film 300 may have a gradient along the thickness direction.

When the bonding apparatus 30 compresses the second semiconductor chip 20 to the first semiconductor chip 10, the rate at which the nonconductive film 300 is discharged from the inside of the bonding zone B-Z to the outside may vary according to the temperature gradient or the viscosity gradient. In response to the temperature gradient or the viscosity gradient, the moving speed of the nonconductive film 300 may be the highest in the adjacent region of the second interface 300S2 and may decrease toward the first interface 300S1. In FIG. 4A, the moving speed of the nonconductive film 300 may be expressed as first to fifth moving speeds v1, v2, v3, v4 and v5 along the thickness direction of the nonconductive film 300. That is, the uppermost portion of the nonconductive film 300 may have the fastest first moving speed v1, and the lowermost portion of the nonconductive film 300 may have the slowest fifth moving speed v5. For the remaining portions of the nonconductive film 300, the moving speed of the corresponding portions may be slowed from the uppermost portion to the lowermost portion.

Referring to FIG. 4B, as the bonding apparatus 30 compresses the second semiconductor chip 20 to the first semiconductor chip 10, the nonconductive film 300 may be pushed out of the bonding zone B-Z. As a result, a tail portion 300T2 of the nonconductive film 300 may be formed outside the bonding zone B-Z. In an embodiment, although it is not illustrated in FIG. 4B, a tail portion 300T1 of the conductive film 300 may be formed outside the bonding zone B-Z.

Meanwhile, due to the pressure applied from the bonding apparatus 30, the nonconductive film 300 may be subjected to compressive stress in the bonding zone B-Z between the first and second semiconductor chips 10 and 20. After the nonconductive film is pushed out of the bonding zone B-Z, the compressive stress may be released, and molecular contraction may occur in the portion of the nonconductive film 300 in which the compressive stress is eliminated. Accordingly, due to the contraction, a swelling phenomenon in which a portion of the nonconductive film 300 is locally bulged may occur.

However, as described above, there is a difference in the moving speed for each position of the nonconductive film 300, thus the position where the swelling phenomenon occurs may be different. As an example, in FIG. 4B, the tail portion 300T2 may include first to third sub-tails 300a, 300b and 300c. The compressive stress of the uppermost portion of the nonconductive film 300, having the fastest moving speed may be released after moving up to the second sub-tail 300b, and thus, first swelling W1 may occur due to the contracting forces F1a and F1b. On the other hand, the compressive stress of the lowermost portion of the nonconductive film 300, having the lowest moving speed may be released in the first sub-tail 300b, and thus, second swelling W2 may occur due to the contracting forces F2a and F2b. As such, a plurality of different swellings may occur according to the position of the second tail portion 300T2 where the compressive stress is released.

Referring to FIG. 4C, the first and second swelling W1 and W2 may change the shape of the second tail portion 300T2 differently. As an example, as illustrated, when the first swelling W1 prevails or occurs more extensively than the second swelling W2, the tail portion 300T2 may be bent toward a higher position than the second interface 300S2.

The position and area where the multiple swelling occurs may vary depending on the moving speed of the corresponding portion of the nonconductive film 300. In addition, the degree of the multiple swelling may vary depending on the compressive stress applied to the corresponding portion of the nonconductive film 300 in the bonding zone B-Z. Accordingly, the first and second tail portions 300T1 and 300T2 of the nonconductive film 300 may have an irregular shape.

Figure 5:
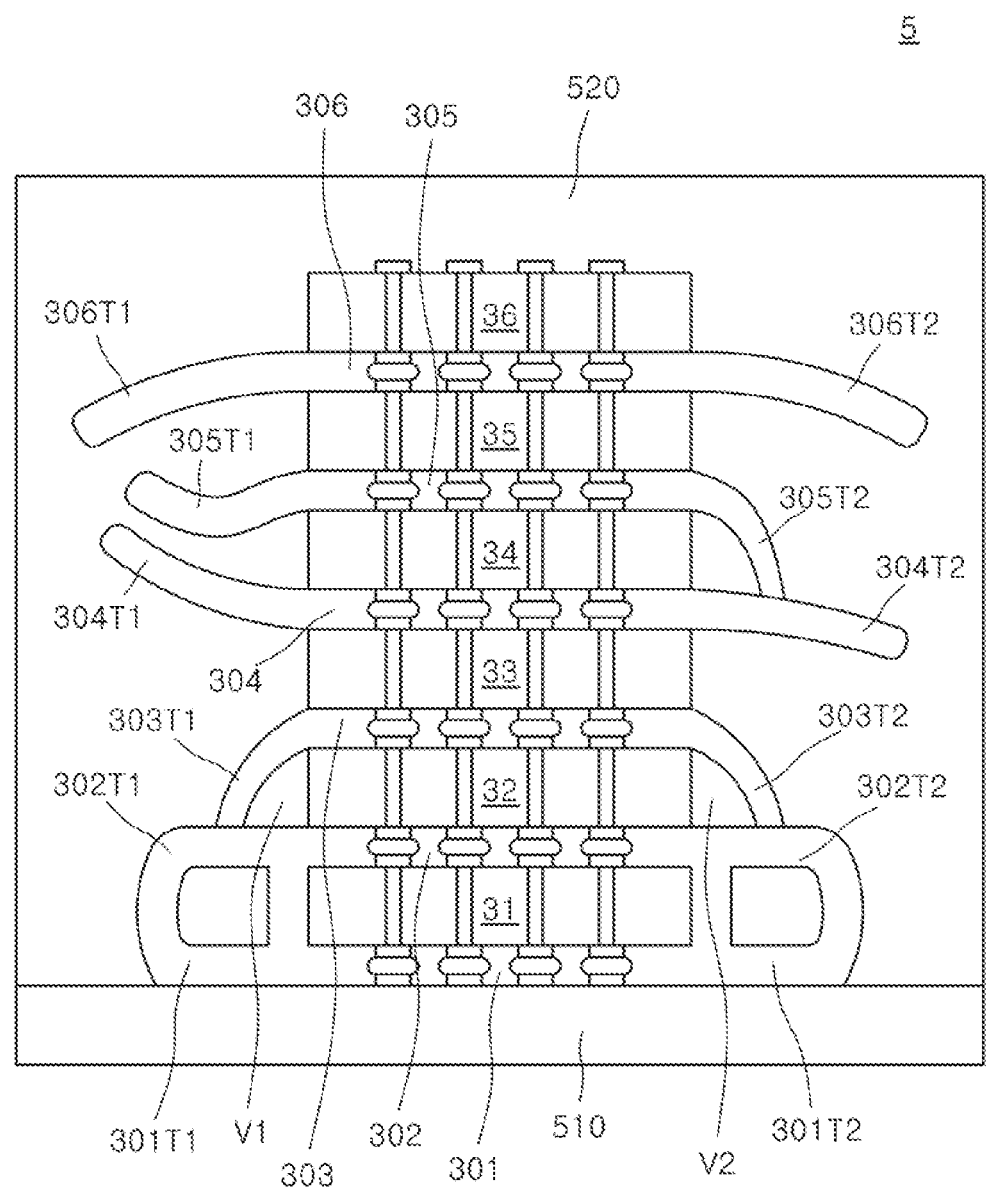
FIG. 5 is a cross-sectional view schematically illustrating a semiconductor package according to a comparative example of the present disclosure.
Figure 5:
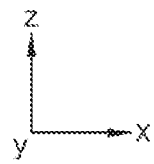

FIG. 5 is a cross-sectional view schematically illustrating a semiconductor package according to a comparative example of the present disclosure. Referring to FIG. 5, the semiconductor package 5 may include a package substrate 510 and first to sixth semiconductor chips 31, 32, 33, 34, 35 and 36 stacked on the package substrate 510. Each of the first to sixth semiconductor chips 31, 32, 33, 34, 35 and 36 may have through electrodes and may be connected to each other by bump bonding. The first semiconductor chip 31 and the package substrate 510 may be connected by bump bonding.

The semiconductor package 5 may include first to sixth nonconductive films 301, 302, 303, 304, 305 and 306 disposed in bonding zones located between the package substrate 510 and the lowermost semiconductor chip 31 and between two adjacent semiconductor chips of the first to sixth semiconductor chips 31, 32, 33, 34, 35 and 36. Here, the first to sixth nonconductive films 301, 302, 303, 304, 305 and 306 may further include respective tail portions 301T1, 301T2, 302T1, 302T2, 303T1, 303T2, 304T1, 304T2, 305T1, 305T2, 306T1 and 306T2 disposed outside the bonding zones. In addition, the semiconductor package 5 may further include a mold layer 520 covering the first to sixth semiconductor chips 31, 32, 33, 34, 35 and 36 and the first to sixth nonconductive films 301, 302, 303, 304, 305 and 306 over the package substrate 510.

The first to sixth semiconductor chips 31, 32, 33, 34, 35 and may be stacked on the package substrate 510 by moving the upper semiconductor chip on which the nonconductive film 300 is laminated onto the package substrate or the lower semiconductor chip using the heated bonding apparatus 30 and pressing the upper semiconductor chip to the package substrate or the lower semiconductor chip, as described above with reference to FIGS. 1 to 3. As a result of the stacking, an example of one shape of the tail portions of the nonconductive film bonding the first to sixth semiconductor chips 31, 32, 33, 34, 35 and 36 is illustrated in FIG. 5.

Referring to FIG. 5, the tail portions 301T1, 301T2, 302T1, 302T2, 303T1, 303T2, 304T1, 304T2, 305T1, 305T2, 306T1 and 306T2 of the first to sixth nonconductive films 301, 302, 303, 304, and 306 may exhibit nonuniform cross-sectional profiles. The tail portions 301T1, 301T2, 302T1, 302T2, 303T1, 303T2, 304T1, 304T2, 305T1, 305T2, 306T1 and 306T2 having nonuniform cross-sectional profiles may cause defects in the semiconductor package 5.

As an example of the defects, when the tail portions 302T1 and 302T2 of the second nonconductive film 302 and the tail portions 303T1 and 303T2 of the third nonconductive film 303 are merged with each other, voids V1 and V2 may be formed in which the mold layer 520 is not completely filled. As another example of the defects, in the case of the fourth nonconductive film 304, when the tail portion 304T1 is bent upward, the tail portion 304T1 may contaminate the fourth semiconductor chip 34. As another example, a crack may occur when at least one or more of the plurality of tail portions 301T1, 301T2, 302T1, 302T2, 303T1, 303T2, 304T1, 304T2, 305T1, 305T2, 306T1 and 306T2 merge with each other. The above-described defects are at risk of degrading the structural stability and electrical reliability of the semiconductor package.

Embodiments of the present disclosure to be described below disclose a technical idea of improving the structural stability and electrical reliability of a semiconductor package applying a nonconductive film as a bonding material between semiconductor chips.

Figure 6A:
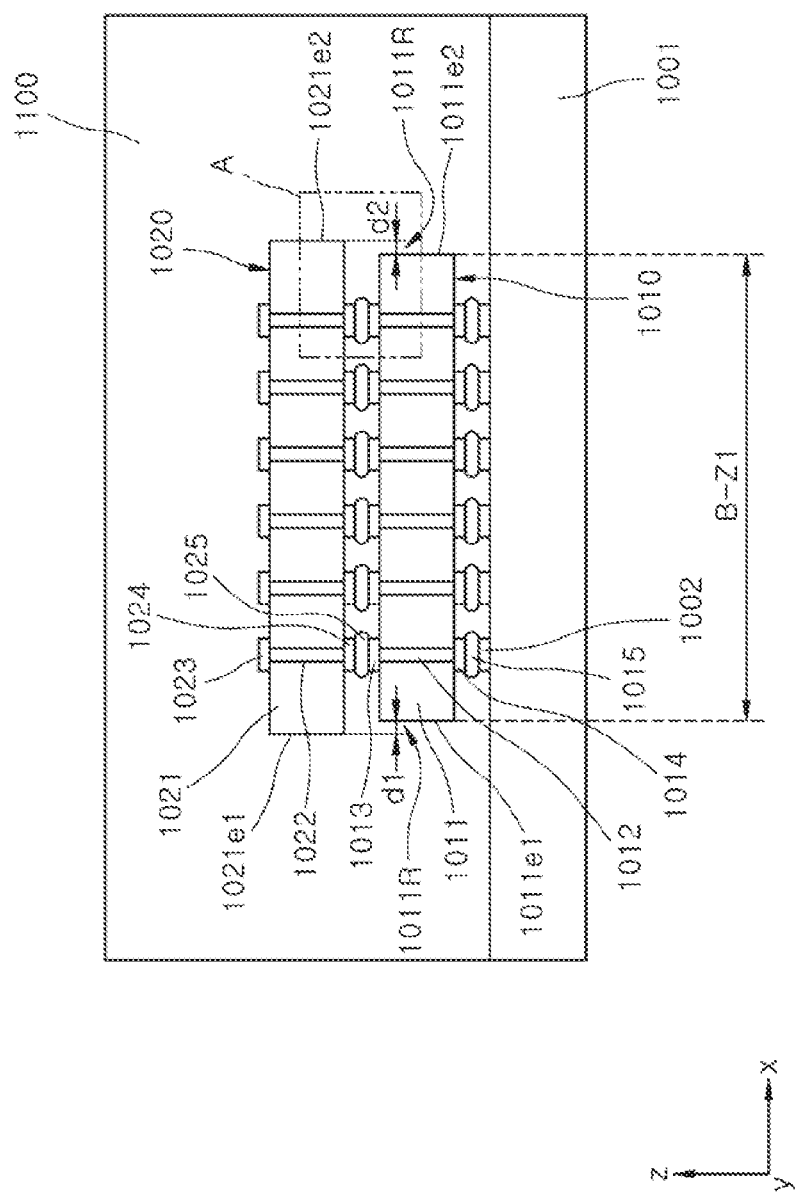
FIG. 6A is a cross-sectional view schematically illustrating a semiconductor package according to an embodiment of the present disclosure.
Figure 6B:
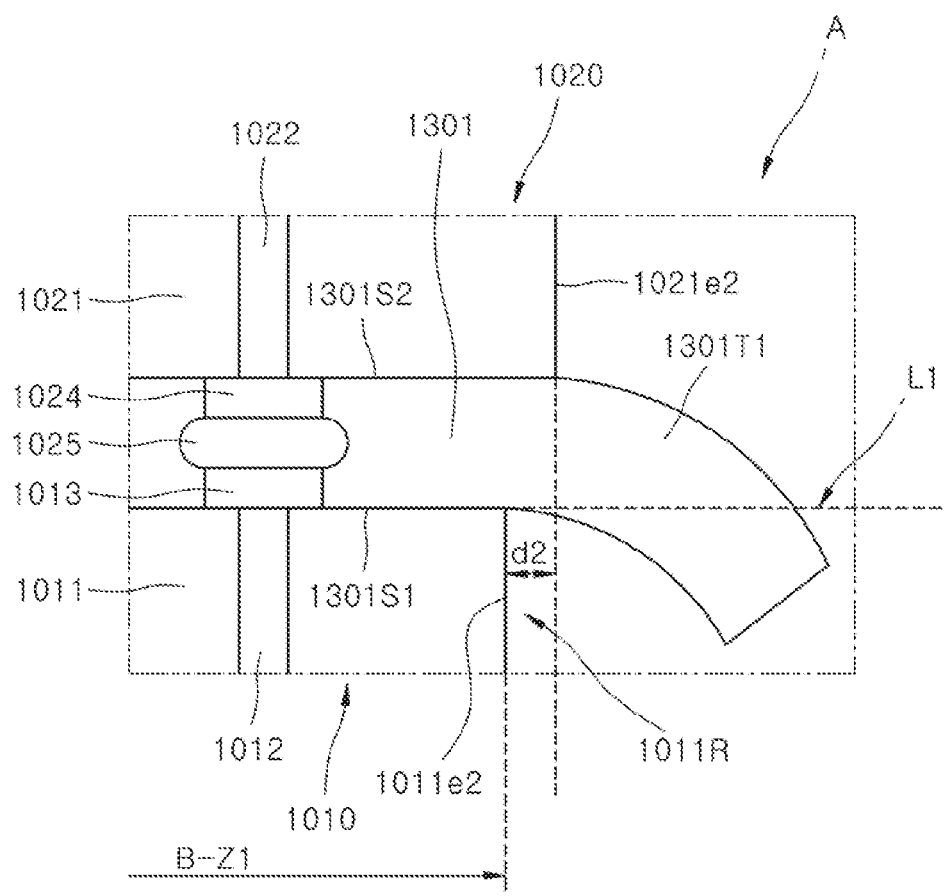
FIG. 6B is an enlarged plan view of a region 'A' of the semiconductor package of FIG. 6A.

FIG. 6A is a cross-sectional view schematically illustrating a semiconductor package according to an embodiment of the present disclosure, and FIG. 6B is an enlarged plan view of a region 'A' of the semiconductor package of FIG. 6A.

Referring to FIG. 6A, the semiconductor package 1000 may include a package substrate 1001, a first semiconductor chip 1010 disposed on the package substrate 1001, and a second semiconductor chip 1020 stacked on the first semiconductor chip 1010. Although it is not illustrated in FIG. 6A for convenience of description, the semiconductor package 1000 may include a nonconductive film disposed in a bonding zone B-Z1 between the package substrate 1001 and the first semiconductor chip 1010, and a bonding zone B-Z1 between the first semiconductor chip 1010 and the second semiconductor chip 1020. Meanwhile, FIG. 6B illustrates a nonconductive film 1301 disposed in a bonding zone B-Z1 between the first semiconductor chip 1010 and the second semiconductor chip 1020. In addition, FIGS. 6A and 6B illustrate a range of the bonding zone B-Z1 along the x-direction in the semiconductor package 1000. That is, the range of the region where the first semiconductor chip and the second semiconductor chip 1020 overlap each other in the x-direction is illustrated as the bonding zone B-Z1.

In an embodiment, the first semiconductor chip 1010 and the second semiconductor chip 1020 may be the same type of chips. In addition, the semiconductor package 1000 may further include a mold layer 1100 burying the first and second semiconductor chips and 1020 and the nonconductive film over the package substrate 1001.

The package substrate 1001 is not particularly limited as long as it performs a function of mounting semiconductor chips. The package substrate 1001 may include a printed circuit board, an interposer, a semiconductor substrate, a ceramic substrate, a polymer substrate, and the like. The package substrate 1001 may include connection bumps 1002 for bonding to the first semiconductor chip 1010 on one surface.

The first semiconductor chip 1010 may have a first chip body portion 1011. The first chip body portion 1011 may include a plurality of integrated circuits therein. As an example, the first chip body portion 1011 may include a plurality of active devices and passive devices. For example, the first chip body portion 1011 may include a plurality of circuit pattern layers and a plurality of insulating layers for electrically insulating the circuit pattern layers. In addition, the first semiconductor chip 1010 may include first through electrodes 1012 disposed inside the first chip body portion 1011, and first upper bumps 1013 and first lower bumps 1014 disposed on and under the first chip body portion 1011, respectively. The first through electrodes 1012 may be electrically connected to the first upper bumps 1013 and the first lower bumps 1014. First solder layers 1015 positioned at one end of each of the first lower bumps may be bonded to connection bumps 1002 of the package substrate 1001. Further, the first chip body portion 1011 may have a first sidewall surface 1011e1 positioned in one edge portion in the lateral direction, that is, the x-direction, and a second sidewall surface 1011e2 positioned in the other edge portion opposite to the one edge portion.

The second semiconductor chip 1020 may have a second chip body portion 1021. The second chip body portion 1021 may include a plurality of integrated circuits therein. As an example, the second chip body portion 1021 may include a plurality of active devices and passive devices. For example, the second chip body portion 1021 may include a plurality of circuit pattern layers and a plurality of insulating layers for electrically insulating the circuit pattern layers. In addition, the second semiconductor chip 1020 may include second through electrodes 1022 disposed inside the second chip body portion 1021, and second upper bumps 1023 and second lower bumps 1024 disposed on and under the second chip body portion 1021, respectively. The second through electrodes 1022 may be electrically connected to the second upper bumps 1023 and the second lower bumps 1024. Second solder layers 1025 positioned at one end of each of the second lower bumps 1024 may be bonded to the first upper bumps 1013 of the first semiconductor chip 1010. Further, the second chip body portion 1021 may have a first sidewall surface 1021e1 positioned in one edge portion in the lateral direction, for example, the x-direction, and a second sidewall surface 1021e2 positioned in the other edge portion opposite to the one edge portion.

Referring to FIG. 6A, at both edge portions in the lateral direction (e.g., the x-direction) of the bonding zone B-Z1, the edge portions of the first semiconductor chip 1010 may be recessed in the lateral direction, based on the edge portions of the first and second sidewall surfaces 1021e1 and 1021e2 of the second semiconductor chip 1020. Accordingly, the first and second sidewall surfaces 1011e1 and 1011e2 of the first chip body portion 1011 may be spaced apart from the first and second sidewall surfaces 1021e1 and 1021e2 of the second chip body portion 1021 in the inner direction of the first chip body portion 1011 by first and second lengths d1 and d2, respectively. In an embodiment, the first and second lengths d1 and d2 may be the same. In an embodiment, when the first and second semiconductor chips 1010 and 1020 have the same size, a portion of an outermost dummy region of the first semiconductor chip 1010 may be removed by the first and second lengths d1 and d2, respectively, along the thickness direction (i.e., z-direction) such that a recess 1011R may be formed in the first semiconductor chip 1010.

Referring to FIG. 6B, by bonding the first and second semiconductor chips 1010 and 1020 in substantially the same manner as described above with reference to FIGS. 1 to 3, the nonconductive film 1301 may include a tail portion 1301T formed to extend from the lateral edge portion of the bonding zone B-Z1 to the outside of the bonding zone B-Z1. Meanwhile, a portion of the nonconductive film 1301, adjacent to the first interface 1301S1 with the first semiconductor chip 1011 may be discharged to the outside of the bonding zone B-Z1 more quickly than a portion of the nonconductive film 300, adjacent to the first interface 300S1 of the comparative example described above with reference to FIGS. 4A to 4C. Accordingly, in the portion of the tail portion 1301T1 of the nonconductive film 1301, adjacent to the first interface 1301S1 of an embodiment, swelling may occur first because the compressive stress is released earlier than the portion adjacent to a second interface 1301S2 with the second chip body portion 1021. In addition, the swelling occurring in the portion of the tail portion 1301T1, adjacent to the first interface 1301S1 may proceed more predominantly than the swelling occurring in the portion adjacent to the second interface 1301S2, and thus, the swelling occurring in the portion adjacent to the first interface 1301S1 may determine the overall bending shape of the tail portion 1301T1. As illustrated in FIG. 6B, the tail portion 1301T1 may be bent downward, based on the interface level L1 of the first interface 1301S1. As an example, the tail portion 1301T1 may be bent in the gravity direction. For example, in this case the tail portion 1301T1 may be bent in the gravity direction towards the package substrate 1001.

According to an embodiment of the present disclosure, in a semiconductor package in which first and second semiconductor chips are sequentially stacked on a package substrate, the first semiconductor chip may have a recess in an edge region in comparison with the second semiconductor chip. The recess may effectively control the shape of the tail portion of a nonconductive film, extending outward from a bonding zone between the first and second semiconductor chips.

Figure 7A:
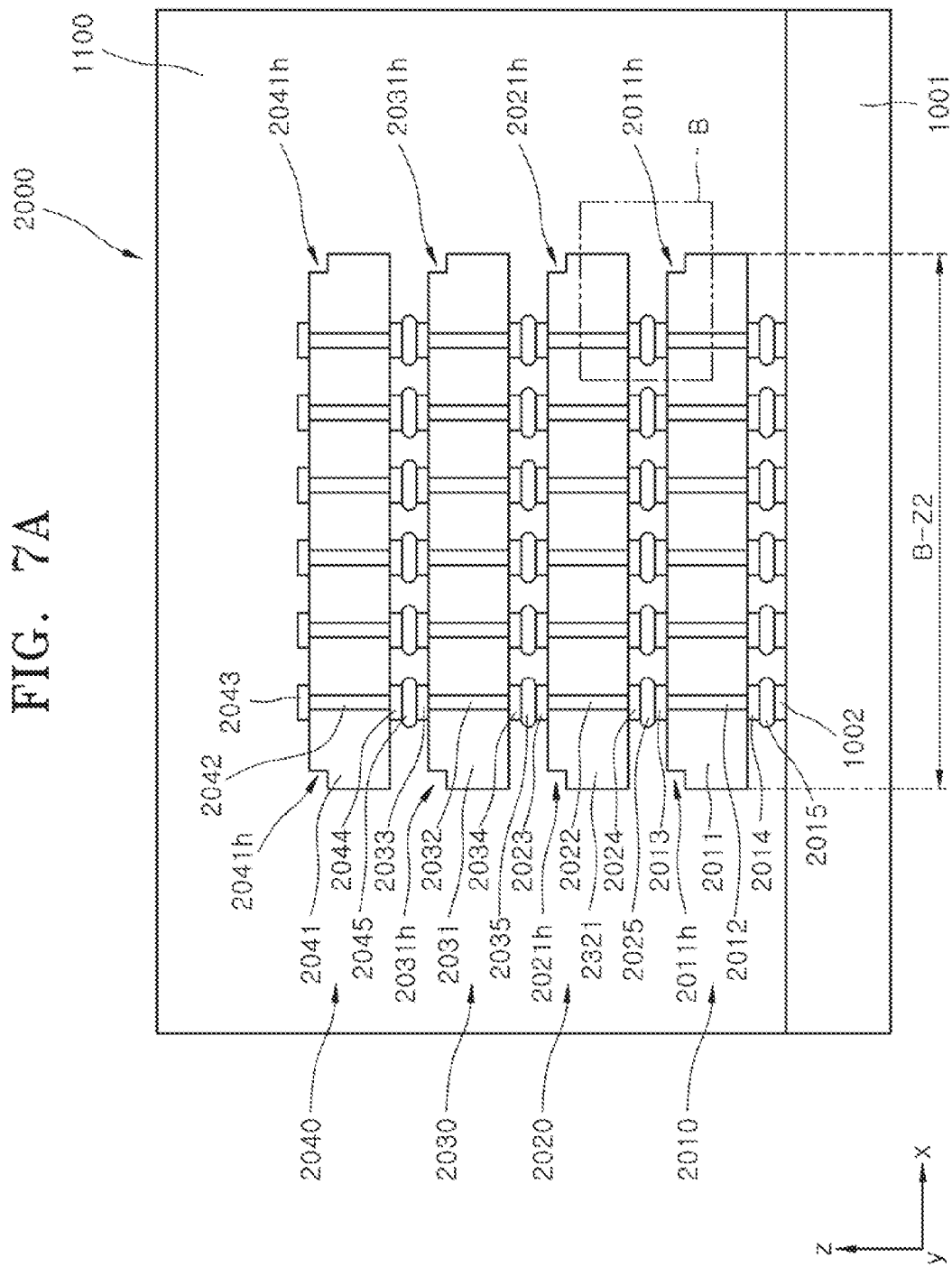
FIG. 7A is a cross-sectional view schematically illustrating a semiconductor package according to another embodiment of the present disclosure.
Figure 7B:
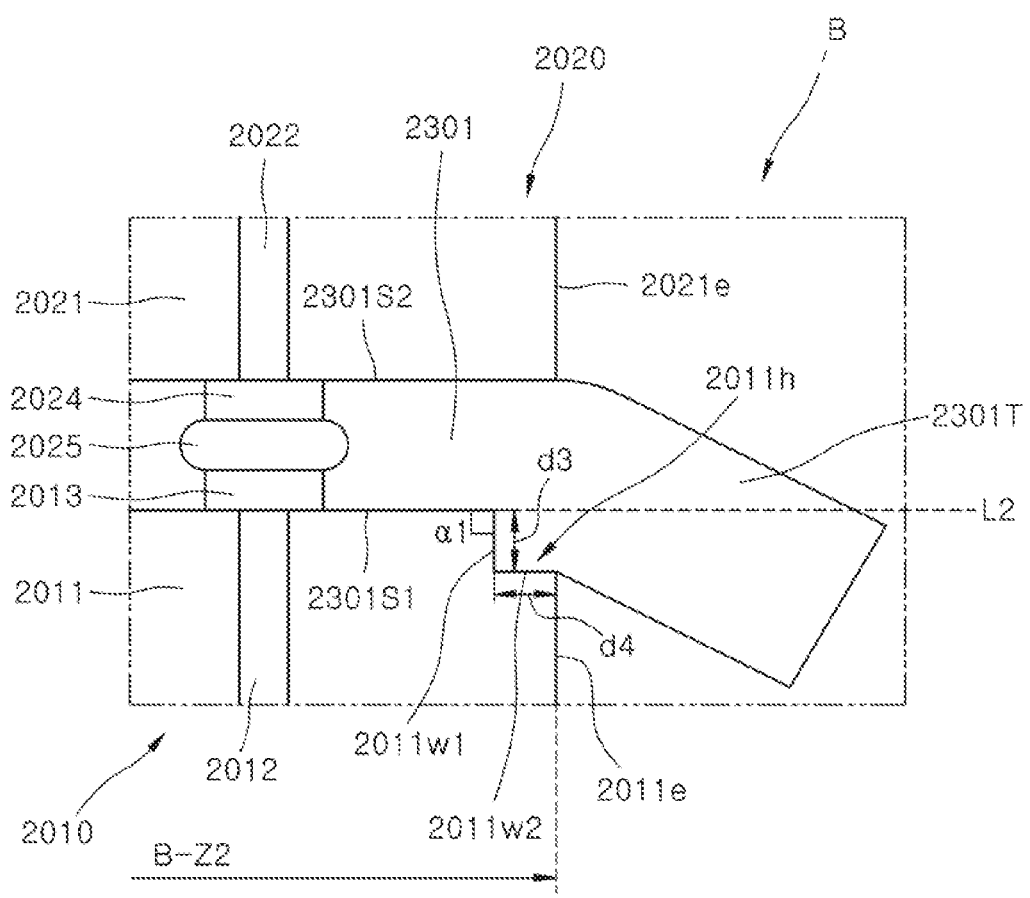
FIG. 7B is an enlarged plan view of a region 'B' of the semiconductor package of FIG. 7A.

FIG. 7A is a cross-sectional view schematically illustrating a semiconductor package according to another embodiment of the present disclosure, and FIG. 7B is an enlarged plan view of a region 'B' of the semiconductor package of FIG. 7A.

Referring to FIG. 7A, the semiconductor package 2000 may include a package substrate 1001, and first to fourth semiconductor chips 2010, 2020, 2030 and 2040 that are sequentially stacked on the package substrate 1001. Although it is not illustrated in FIG. 7A for convenience of description, the semiconductor package 2000 may include nonconductive films disposed in a bonding zone B-Z2 between the package substrate 1001 and the first semiconductor chip 2010 and bonding zones B-Z2 between two adjacent semiconductor chips of the first to fourth semiconductor chips 2010, 2020, 2030 and 2040. FIGS. 7A and 7B illustrate a range of the bonding zone B-Z2 along the x-direction in the semiconductor package 2000. Meanwhile, FIG. 7B illustrates a nonconductive film disposed in the bonding zone B-Z2 between the first semiconductor chip 2010 and the second semiconductor chip 2020 as an example. In an embodiment, the first to fourth semiconductor chips 2010, 2020, 2030 and 2040 may be the same type of chips. That is, each of the first to fourth semiconductor chips 2010, 2020, and 2040 may have the same configuration. In addition, the semiconductor package 2000 may further include a mold layer 1100 for burying the first to fourth semiconductor chips 2010, 2020, 2030 and 2040 and the nonconductive film over the package substrate 1001.

The first semiconductor chip 2010 may include a first chip body portion 2011. The first chip body portion 2011 may include a plurality of integrated circuits therein. As an example, the first chip body portion 2011 may include a plurality of active devices and passive devices. For example, the first chip body portion 2011 may include a plurality of circuit pattern layers and a plurality of insulating layers for electrically insulating the circuit pattern layers. In addition, the first semiconductor chip 2010 may include first through electrodes 2012 disposed in the first chip body portion 2011, and first upper bumps 2012 and first lower bumps 2014 disposed on and under the first chip body portion 2011, respectively. The first through electrodes 2012 may be electrically connected to the first upper bumps 2012 and first lower bumps 2014. First solder layers positioned at one end of each of the first lower bumps 2014 may be bonded to connection bumps 1002 of the package substrate 1001.

Referring to FIG. 7B, at side edge portions of the bonding zone B-Z2 of the first semiconductor chip 2010 and the second semiconductor chip 2020, the first semiconductor chip 2010 may have first hollow portions 2011h formed from a first interface 2301S1 (that is, an upper surface of the first chip body portion 2011 outside the first hollow portion 2011h) in contact with the non-conductive film layer 2301 in the inner direction of the first semiconductor chip 2010. The first hollow portions 2011h may be formed on the edge portions of the first semiconductor chip 2010. The first hollow portion 2011h may have an 'L' shape or a stair shape. The first hollow portion 2011h may include a sidewall surface 2011w1 and a bottom surface 2011w2. The bottom surface 2011w2 of the first hollow portion 2011h may be connected to the sidewall surface 2011e of the first chip body portion 2011. The sidewall surface 2011w1 of the first hollow portion 2011h may have an inclination angle α1 perpendicular to the first interface 2301S1. The first hollow portion 2011h may have a depth d3 along the sidewall surface 2011w1 and may have a width d4 along the bottom surface 2011w2.

Referring to FIG. 7B, the first and second semiconductor chips and 1020 may be bonded using a method substantially the same as the method described above with reference FIGS. 1 to 3, so that the nonconductive film 2301 may include a tail portion 2301T extending from the lateral edge portions of the bonding zone B-Z2 to the outside of the bonding zone B-Z2. Meanwhile, a portion of the nonconductive film 2301, adjacent to the first interface 2301S1 with the first semiconductor chip 2010 may be quickly discharged to the outside of the bonding zone B-Z2 through more extended path by the first hollow portion 2011h, compared with the portion of the nonconductive film 300, adjacent to the first interface 300S1 of the comparative example described above with reference to FIGS. 4A to 4C. Accordingly, in a portion of the tail portion 2301T adjacent to the first interface 2301S1, the compressive stress may be released faster than a portion adjacent to a second interface 2301S2 with the second semiconductor chip 2020, and thus swelling may occur first. In addition, the swelling occurring in the portion of the tail portion 2301T, adjacent to the first interface 2301S1 is formed dominantly than the swelling occurring in the portion adjacent to the second interface 2301S2, so that the entire bending shape of the tail portion 2301T may be formed to be bent downward, based on the interface level L2 of the first interface 2301S1. As an example, the tail portion 2301T may be bent in the gravity direction. For example, in this case the tail portion 2301T may be bent in the gravity direction towards the package substrate 1001.

Likewise, each of the second to fourth semiconductor chips 2020, 2030 and 2040 may have the same configuration as the first semiconductor chip 2010. As an example, the second to fourth semiconductor chips 2020, 2030 and 2040 may have second to fourth chip body portions 2021, 2031 and 2041, respectively. The second to fourth semiconductor chips 2020, 2030 and 2040 may have second to fourth through electrodes, second to fourth upper bumps, and second to fourth lower bumps, respectively. Second to fourth solder layers 2025, 2035 and 2045 may bond the first upper bump and the second lower bump, the second upper bump and the third lower bump, and the third upper bump and the fourth lower bump, respectively.

The second to fourth semiconductor chips 2020, 2030 and may have second to fourth hollow portions 2021h, 2031h and 2041h over respective edge regions, respectively. The configuration of each of the hollow portions 2021h, 2031h and 2041h may be substantially the same as that of the first hollow portion 2011h. The first to fourth semiconductor chips 2010, 2020, 2030 and 2040 have the first to fourth hollow portions 2010h, 2021h, 2031h and 2041h, so that the tail portion of the nonconductive film between the first and second semiconductor chips 2010 and 2020, the tail portion of the nonconductive film between the second and third semiconductor chips 2020 and 2030, and the tail portion of the nonconductive film between the third and fourth semiconductor chips 2030 and 2040 can be controlled to be bent in substantially the same shape. That is, the tail portions may be bent in substantially the same direction, for example, in the gravity direction.

Meanwhile, although the semiconductor package 2000 in which four semiconductor chips 2010, 2020, 2030 and 2040 are stacked on the package substrate 1001 is described with reference to FIGS. 7A and 7B, the number of the stacked semiconductor chips might not be necessarily limited to four, and other various numbers may be applied.

As described above, according to an embodiment of the present disclosure, in a semiconductor package in which a plurality of semiconductor chips are stacked on a package substrate to overlap with each other in up and down directions, the plurality of semiconductor chips may have hollow portions over edge portions. The shapes of the tail portions of a nonconductive film, extending outward from a bonding zone between the plurality of the semiconductor chips can be effectively controlled by the hollow portions.

Figure 8A:
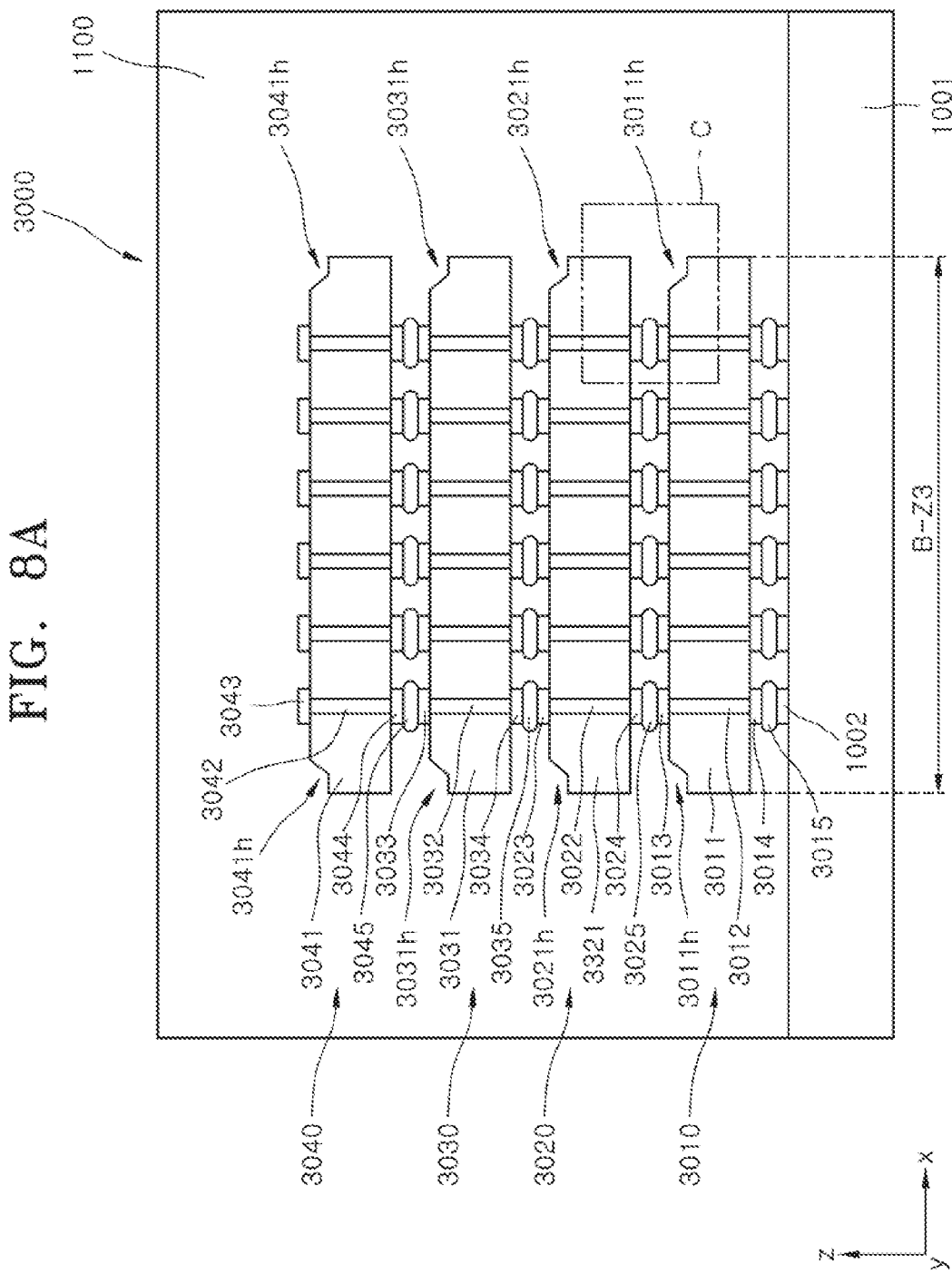
FIG. 8A is a cross-sectional view schematically illustrating a semiconductor package according to yet another embodiment of the present disclosure.
Figure 8B:
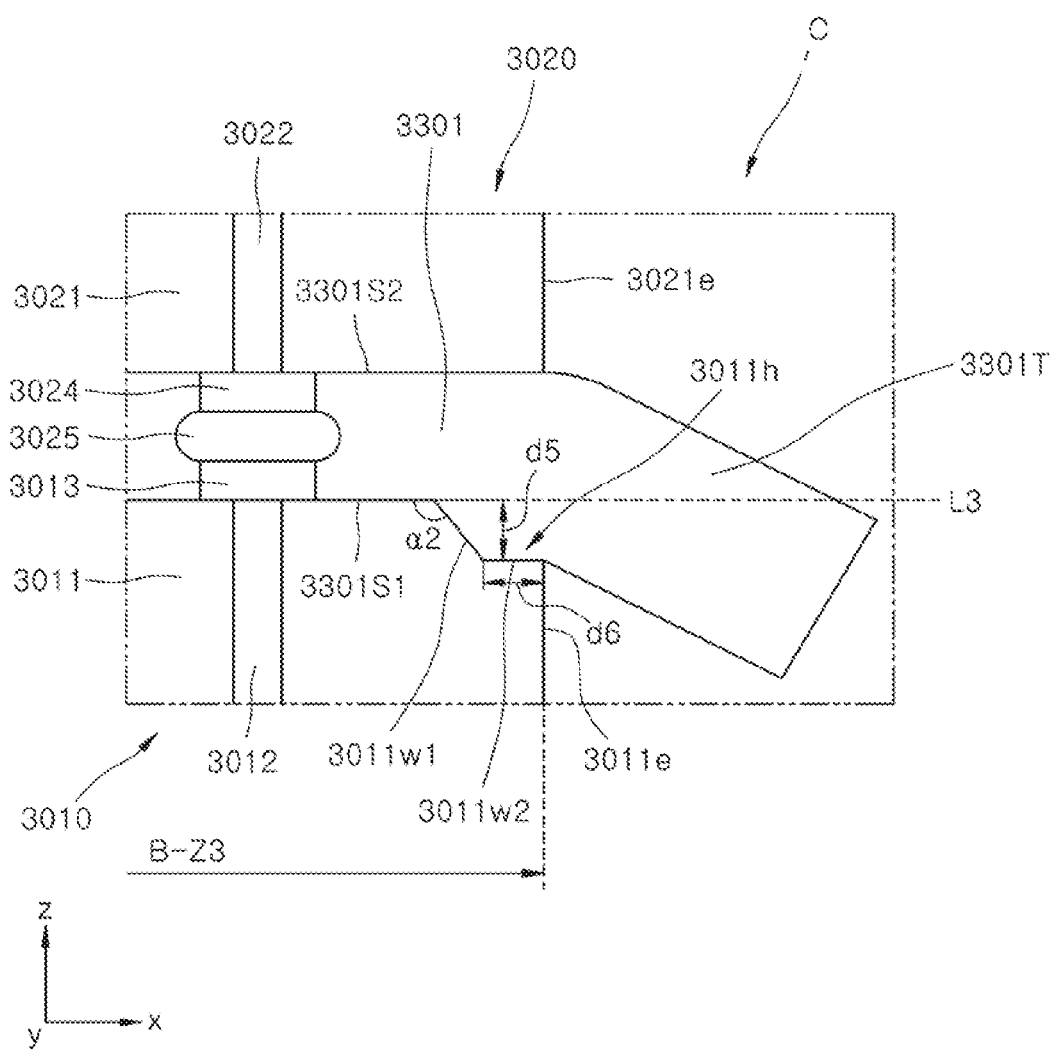
FIG. 8B is an enlarged plan view of a region 'C' of the semiconductor package of FIG. 8A.

FIG. 8A is a cross-sectional view schematically illustrating a semiconductor package according to yet another embodiment of the present disclosure, and FIG. 8B is an enlarged plan view of a region 'C' of the semiconductor package of FIG. 8A.

Referring to FIG. 8A, the semiconductor package 3000 may have substantially the same configuration as the semiconductor package 2000 described above with reference to FIGS. 7A and 7B except for the first to fourth hollow portions 3011h, 3021h, 3031h and 3041h formed over edge regions of first to fourth semiconductor chips 3010, 3020, 3030 and 3040, respectively. As an example, first to fourth through electrodes 3012, 3022, 3032 and 3042, first to fourth upper bumps 3013, 3023, 3033 and 3043, first to fourth lower bumps 3014, 3024, 3034 and 3044, and first to fourth solder layers 3015, 3025, 3035 and 3045 which are disposed in/on/under first to fourth chip body portions 3011, 3021, 3031 and 3041 of the first to fourth semiconductor chips 3010, 3020, 3030 and 3040 may be substantially the same as the first through electrodes 2012, 2022, and 2042, first to fourth upper bumps 2013, 2023, 2033 and 2043, first to fourth lower bumps 2014, 2024, 2034 and 2044, and first to fourth solder layers 2015, 2025, 2035 and 2045 which are disposed in/on/under the first to fourth chip body portions 2011, 2021, 2031 and 2041 of the first to fourth semiconductor chips 2010, 2020, 2030 and 2040 described above with reference to FIGS. 7A and 7B.

In an embodiment, the first to fourth hollow portions 3011h, 3021h, 3031h and 3041h of the first to fourth semiconductor chips 3010, 3020, 3030 and 3040 may have the same configurations each other. For example, FIG. 8B illustrates the first hollow portion 3011h of the first semiconductor chip 3010.

Referring to FIG. 8B, the first hollow portion 3011h may be formed on the edge region of the first semiconductor chip 3010. The first hollow portion 3011h may have a sidewall surface 3011w1 and a bottom surface 3011w2. The bottom surface 3011w2 of the first hollow portion 3011h may be connected to the sidewall surface 3011e of the first chip body portion 3011. The sidewall surface 3011w1 of the first hollow portion 3011h may have an inclination angle $\alpha 2$ that is non-perpendicular to a first interface 3301S1 (that is, an upper surface of the first chip body portion 3011 outside the first hollow portion 3011h). For example, the inclination angle $\alpha 2$ may be greater than 90° and less than 180°. The first hollow portion 3011h may have a depth d5 in a direction perpendicular to the bottom surface 3011w2 and have a width d6 in a direction parallel to the bottom surface 3011w2.

By bonding the first and second semiconductor chips 3010 and 3020 in substantially the same manner as described above with reference to FIGS. 1 to 3, the nonconductive film 3301 may include a tail portion 3301T extending from a lateral edge portion of a bonding zone B-Z3 to the outside of the bonding zone B-Z3. Meanwhile, a portion of the nonconductive film 3301, adjacent to the first interface 3301S1 with the first semiconductor chip 3010 may be discharged faster through a path extended by the first hollow portion 3011h than a portion of the nonconductive film 300, adjacent to the first interface 300S1 described above with reference to FIGS. 4A to 4C.

In an embodiment, the sidewall surface 3011w1 of the first hollow portion 3011h has the inclination angle $\alpha 2$ that is non-perpendicular to a first bonding surface 3301S, so that turbulence of the nonconductive film 3301 can be prevented from occurring in the region adjacent to the first hollow portion 3011 when the nonconductive film 3301 moves in the lateral direction by the pressure applied by the bonding apparatus 30. Through this, the tail portion 3301T may be further controlled to be uniformly bent downward, based on the interface level L3 of the first interface 3301S1.

Likewise, each of the second to fourth semiconductor chips 3020, 3030 and 3040 may have substantially the same configuration as the first semiconductor chip 3010. The second to fourth semiconductor chips 3020, 3030 and 3040 may have second to fourth hollow portions 3021h, 3031 and 3041h on edge regions, respectively. The configurations of the second to fourth hollow portions 3021h, 3031 and 3041h may be substantially the same as the configuration of the first hollow portion 3011h of the first semiconductor chip 3010. The first to fourth semiconductor chips 3010, 3020, 3030 and 3040 have the first to fourth hollow portions 3011h, 3021, 3031h and 3041h having substantially the same configuration, respectively, so that the tail portion of the nonconductive film between the first and second semiconductor chips and 3020, the tail portion of the nonconductive film between the second and third semiconductor chips 3020 and 3030, and the tail portion of the nonconductive film between the third and fourth semiconductor chips 3030 and 3040 can be controlled to be bent in substantially the same shape. That is, the tail portions can be bent in substantially the same direction, for example, in the gravity direction.

Meanwhile, although the semiconductor package 3000 in which four semiconductor chips 3010, 3020, 3030 and 3040 are stacked on the package substrate 1001 is described with reference to FIGS. 8A and 8B, the number of the stacked semiconductor chips might not be necessarily limited to four, and other various numbers may be applied.

Figure 9A:
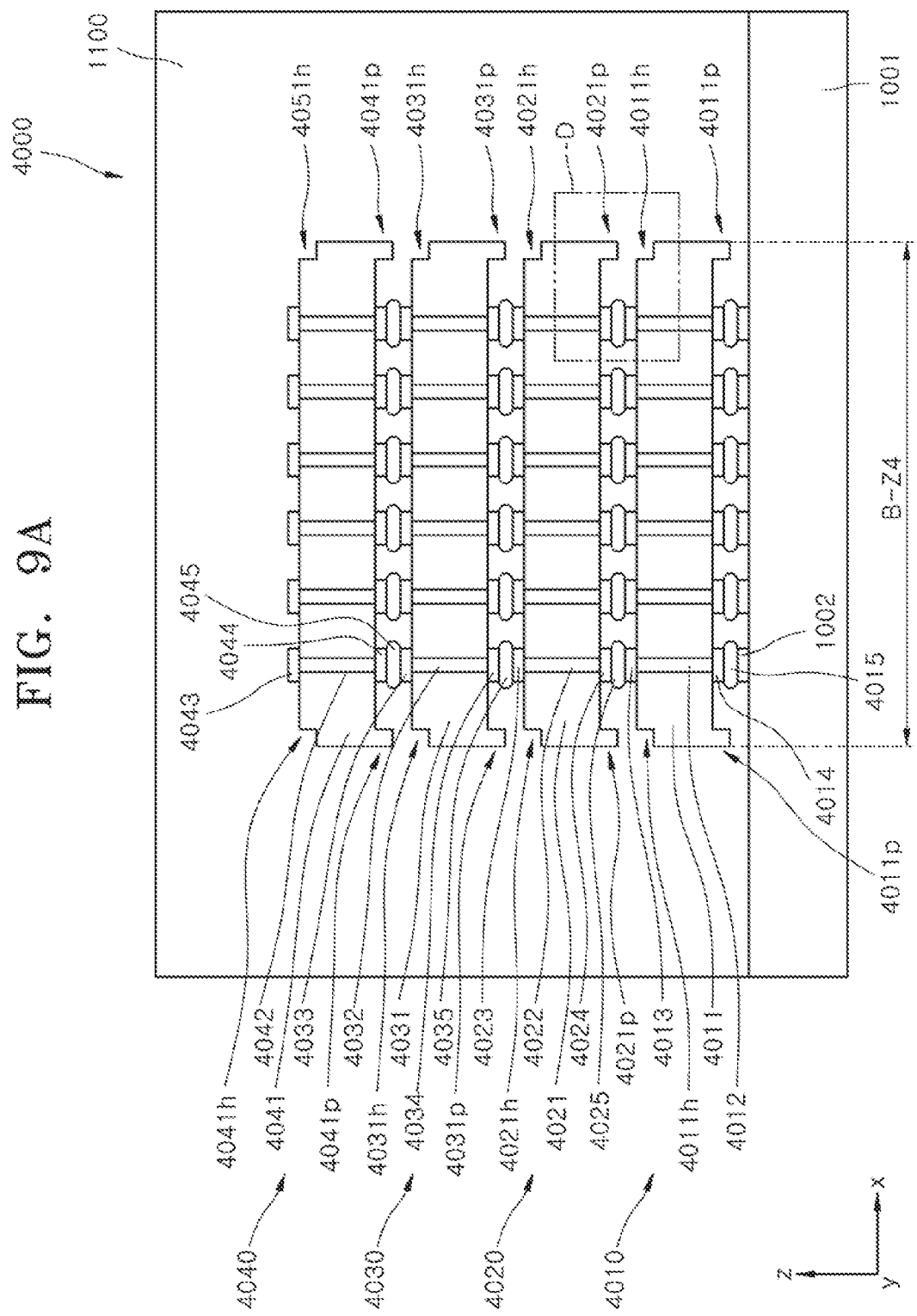
FIG. 9A is a cross-sectional view schematically illustrating a semiconductor package according to still yet another embodiment of the present disclosure.
Figure 9B:
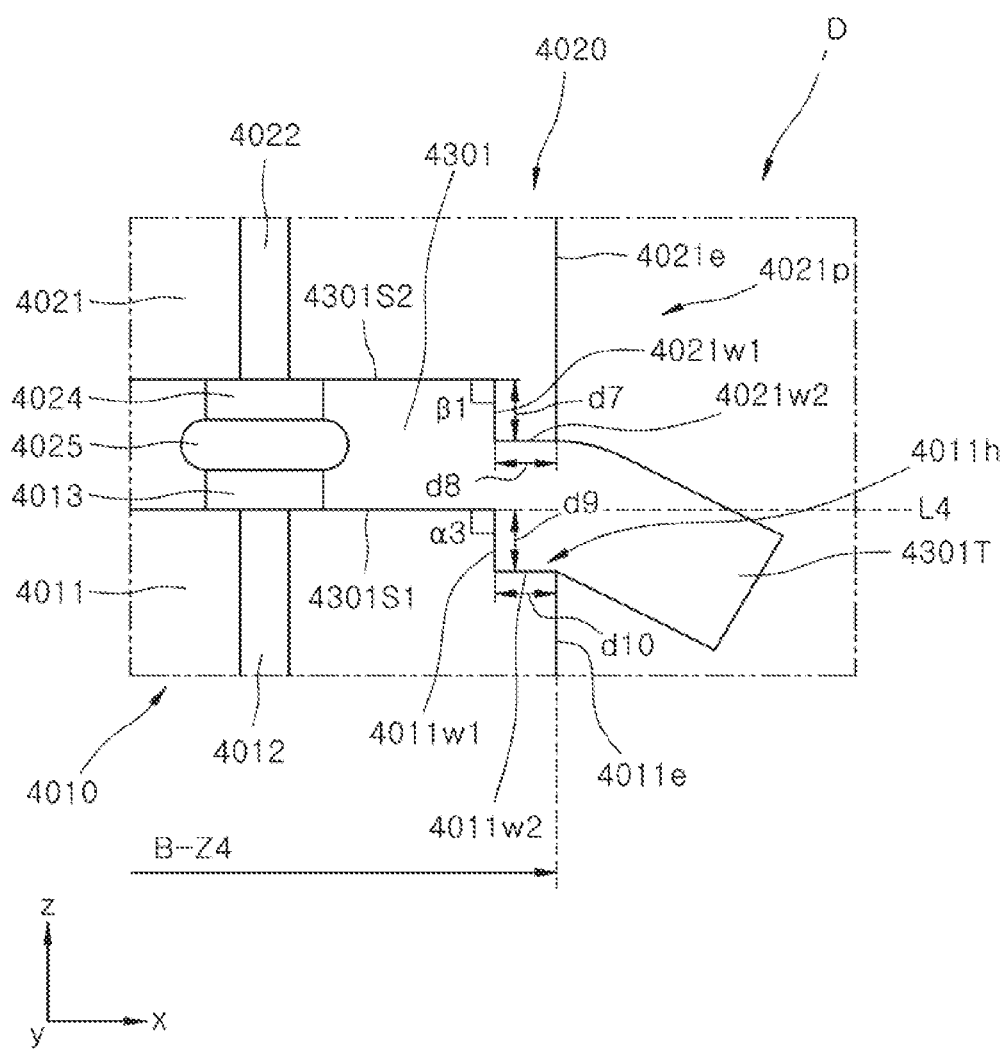
FIG. 9B is an enlarged plan view of a region 'D' of the semiconductor package of FIG. 9A.

FIG. 9A is a cross-sectional view schematically illustrating a semiconductor package according to still yet another embodiment of the present disclosure, and FIG. 9B is an enlarged plan view of a region 'D' of the semiconductor package of FIG. 9A.

Referring to FIG. 9A, the semiconductor package 4000 may have substantially the same configuration as the semiconductor package 2000 described above with reference to FIGS. 7A and 7B, except for a configuration that further including first to fourth protrusions 4011p, 4021p, 4031p and 4041p formed under the edge regions of first to fourth semiconductor chips 4010, 4020, 4030 and 4040, respectively. As an example, first to fourth through electrodes 4012, 4022, 4032 and 4042, first to fourth upper bumps 4013, 4023, 4033 and 4043, first to fourth lower bumps 4014, 4024, and 4044, first to fourth solder layers 4015, 4025, 4035 and 4045, and first to fourth hollow portions 4011h, 4021h, 4031h and 4041h of first to fourth chip body portions 4011, 4021, 4031 and of the first to fourth semiconductor chips 4010, 4020, 4030 and may substantially the same as the first to fourth through electrodes 2012, 2022, 2032 and 2042, first to fourth upper bumps 2013, 2023, 2033 and 2043, first to fourth lower bumps 2014, 2024, and 2044, first to fourth solder layers 2015, 2025, 2035 and 2045, and first to fourth hollow portions 2011h, 2021h, 2031h and 2041h of the first to fourth chip body portions 2011, 2021, 2031 and of the first to fourth semiconductor chips 2010, 2020, 2030 and described above with reference to FIGS. 7A and 7B.

In an embodiment, the first to fourth protrusions 4011p, 4021p, 4031p and 4041p of the first to fourth semiconductor chips 4010, 4020, 4030 and 4040 may have substantially the same configurations each other. For example, FIG. 9B illustrates the second protrusion 4021p of the second semiconductor chip 4020.

Referring to FIG. 9B, the second protrusion 4021p may be formed under an edge region of the second semiconductor chip 4020. That is, the second semiconductor chip 4020 comprises the second protrusion 4021p extending in an inner direction of the nonconductive film 4301 from a second interface 4301S2 that is a lower surface of the second semiconductor chip 4020 in contact with the nonconductive film 4301. The second protrusion 4021p may include a sidewall surface 4021w1 and a bottom surface 4021w2. The bottom surface 4021w2 of the second protrusion 4021p may be connected to the sidewall surface 4021e of the second chip body portion 4021. The sidewall surface 4021w1 of the second protrusion 4021p may have an inclination angle β1 perpendicular to the second interface 4. The second protrusion 4021p may have a length d7 in a direction perpendicular to the bottom surface 4021w2, and may have a width d8 in a direction parallel to the bottom surface 4021w2.

Meanwhile, the first hollow portion 4011h of the first semiconductor chip 4010 may be disposed at a position corresponding to the second protrusion 4021p of the second semiconductor chip 4020. The first hollow portion 4011h may be formed to face the second protrusion 4021p along the z-direction. The first hollow portion 4011h may have a sidewall surface 4011w1 and a bottom surface 4011w2. The bottom surface 4011w2 of the first hollow portion 4011h may be connected to the sidewall surface 4011e of the first chip body portion 4011. The sidewall surface 4011w1 of the first hollow portion 4011h may have an inclination angle α3 perpendicular to a first interface 4301S1 (that is, an upper surface of the first chip body portion 4011 outside the first hollow portion 4011h). The first hollow portion 4011h may have a depth d9 in a direction perpendicular to the bottom surface 4011w2, and may have a width d10 in a direction parallel to the bottom surface 4011w2.

Referring to FIG. 9B, the first and second semiconductor chips and 4020 are bonded in substantially the same manner as described above with reference to FIGS. 1 to 3, so that the nonconductive film 4301 may include a tail portion 4301T extending from lateral edge of a bonding zone B-Z4 to the outside of the bonding zone B-Z4. Meanwhile, when pressure is applied by a bonding apparatus 30, a portion of the nonconductive film 4301, adjacent to the first interface 4301S1 with the first semiconductor chip 4010 may be discharged more quickly to the outside of the bonding zone B-Z4 along the wider path by the first hollow portion 4011h, as compared to the portion adjacent to the first interface 300S1 of the nonconductive film 300 of the comparative example described above with reference to FIGS. 4A to 4C. In addition, a portion of the nonconductive film layer 4301, adjacent to a second interface 4301S2 with the second semiconductor chip 4020 may be slowly discharged to the outside of the bonding zone B-Z4 because the second protrusion serves as an obstacle, as compared with the portion adjacent to the second interface 300S2 of the nonconductive film layer 300 of the comparative example described above with reference to FIGS. 4A to 4C.

Accordingly, the compressive stress of the portion of the nonconductive film 4301, adjacent to the first interface 4301S1 with the first semiconductor chip 4010 may be released faster than the portion adjacent to the second interface 4301S2 with the second semiconductor chip 4020, and swelling may occur faster. In addition, the swelling that occurs at the portion of the nonconductive film 4301, adjacent to the first interface 4301S1 may be formed to be superior to the swelling that occurs at the portion adjacent to the second interface 4301S2. As a result, the overall bending shape of the tail portion 4301T can be effectively controlled to be directed downward, based on the interface level L4 of the first interface 4301S1. As an example, the tail portion 4301T may be bent in the gravity direction. In an embodiment, the tail portion 4301T may be bent in the gravity direction towards the package substrate 1001.

In an embodiment, the first to fourth semiconductor chips 4010, 4020, 4030 and 4040 may have substantially the same configuration. That is, each of the first to fourth semiconductor chips 4010, 4020, 4030 and 4040 may have first to fourth hollow portions 4011h, 4021h, 4031h and 4041h having the same configuration and first to fourth protrusions 4011p, 4021p, 4031p and 4041p having the same configuration, respectively, over and below respective edge regions.

In an embodiment, the first to fourth semiconductor chips 4010, 4020, 4030 and 4040 further include first to fourth protrusions having substantially the same configuration, so that bending of the tail portion of the nonconductive film between the first and second semiconductor chips 4010 and 4020, the tail portion of the nonconductive film between the second and third semiconductor chips 4020 and 4030, tail portion of the nonconductive film between the third and fourth semiconductor chips 4030 and 4040 can be controlled more effectively.

Meanwhile, although the semiconductor package 4000 in which four semiconductor chips 4010, 4020, 4030 and 4040 are stacked on the package substrate 1001 is described with reference to FIGS. 9A and 9B, the number of the stacked semiconductor chips is not necessarily limited to four, and other various numbers can be applied.

Figure 10A:
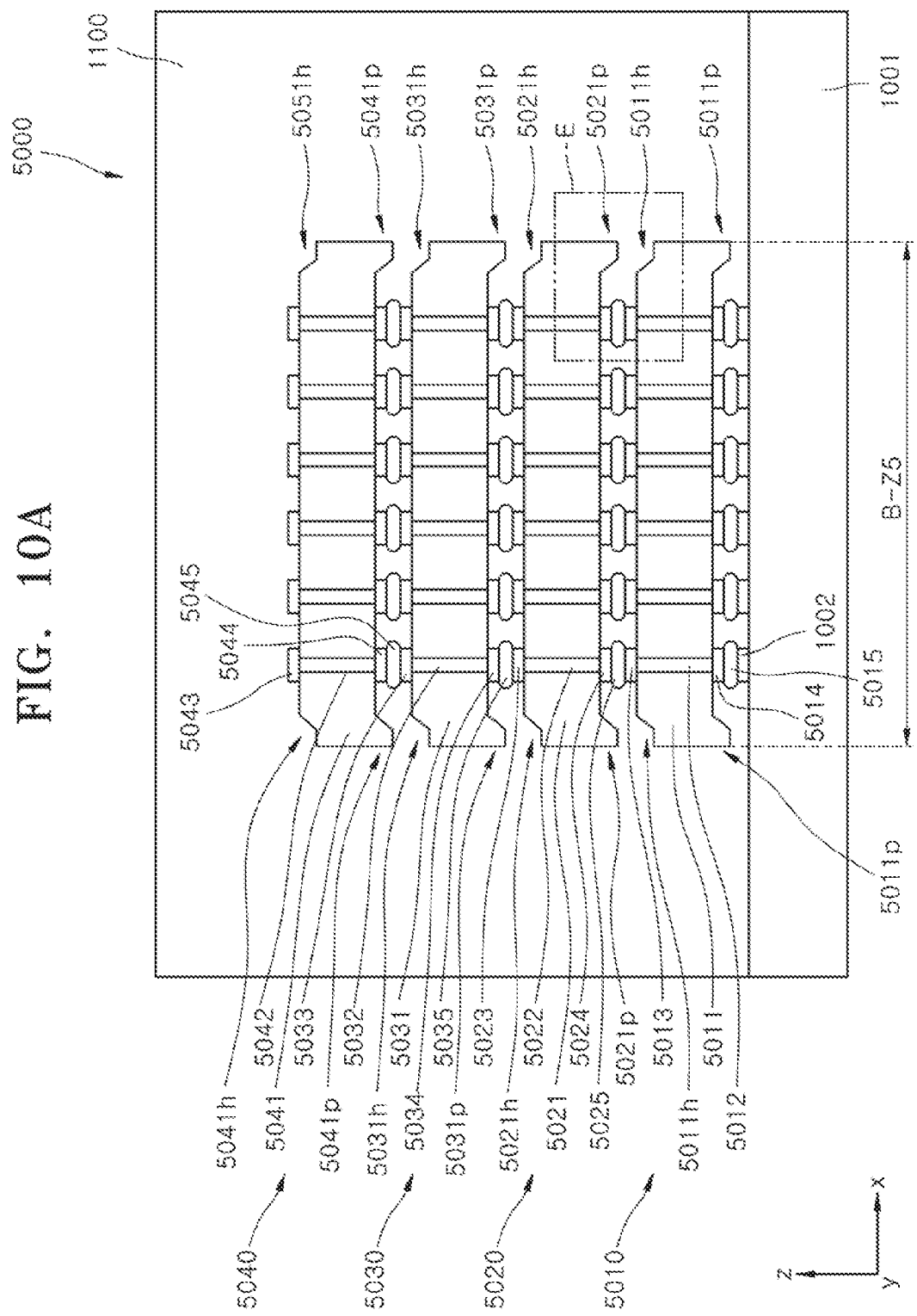
FIG. 10A is a cross-sectional view schematically illustrating a semiconductor package according to still yet another embodiment of the present disclosure.
Figure 10B:
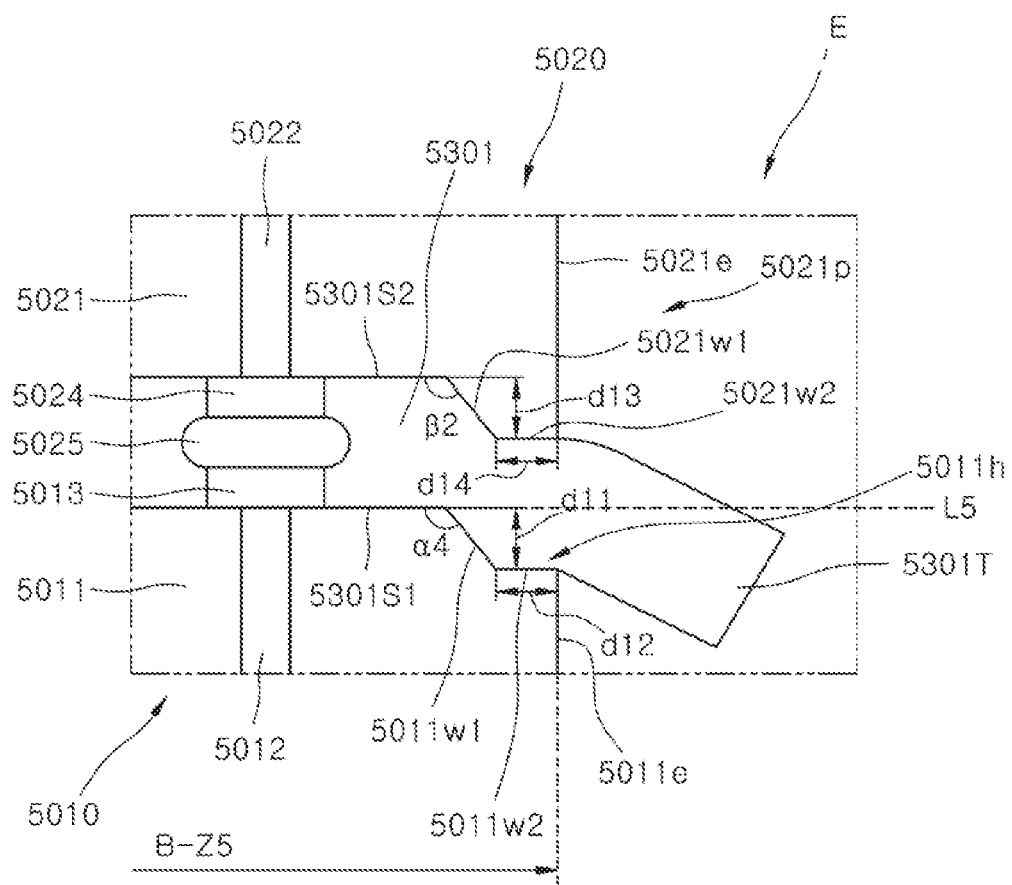
FIG. 10B is an enlarged plan view of a region 'E' of the semiconductor package of FIG. 10A.

FIG. 10A is a cross-sectional view schematically illustrating a semiconductor package according to still yet another embodiment of the present disclosure, and FIG. 10B is an enlarged plan view of a region 'E' of the semiconductor package of FIG. 10A.

Referring to FIG. 10A, the semiconductor package 5000 may have substantially the same configuration as the semiconductor package 4000 described above with reference FIGS. 9A and 9B, except for configurations of first to fourth hollow portions 5011h, 5021h, 5031h and 5041h and first to fourth protrusions 5011p, 5021p, 5031p and 5041p disposed on and under edge regions of first to fourth semiconductor chips 5010, 5020, 5030 ad 5040, respectively. As an example, first to fourth through electrodes 5012, 5022, 5032 and 5042, first to fourth upper bumps 5013, 5023, 5033 and 5043, first to fourth lower bumps 5014, 5024, 5034 and 5044, and first to fourth solder layers 5015, 5025, 5035 and 5045 of the first to fourth chip body portions 5011, 5021, 5031 and 5041 of the first to fourth semiconductor chips 5010, 5020, 5030 and 5040 may have substantially the same configurations as the first to fourth through electrodes 4012, 4022, 4032 and 4042, first to fourth upper bumps 4013, 4023, 4033 and 4043, and first to fourth solder layers 4015, 4025, 4035 and 4045 of the first to fourth chip body portions 4011, 4021, 4031 and 4041 of the first to fourth semiconductor chips 4010, 4020, 4030 and 4040 described above with reference to FIGS. 9A and 9B.

In an embodiment, the first to fourth hollow portions 5011h, 5021h, 5031h and 5041h may have substantially the same configurations each other, and the first to fourth protrusions 5011p, 5021p, 5031p and 5041p may have substantially the same configurations each other. As an example, FIG. 10B illustrates the first hollow portion 5011h of the first semiconductor chip 5010 and the second protrusion 5021p of the second semiconductor chip 5020.

Referring to FIG. 10B, the first hollow portion 5011h may be disposed over an edge region of the first semiconductor chip 5010, and the second protrusion 5021p may be disposed below an edge region of the second semiconductor chip 5020. The first hollow portion 5011h and the second protrusion 5021p may be formed to face each other along the z-direction.

The first hollow portion 5011h may have a sidewall surface 5011w1 and a bottom surface 5011w2. The bottom surface 5011w2 of the first hollow portion 5011h may be connected to a sidewall surface 5011e of the first chip body portion 5011. The sidewall surface 5011w1 of the first hollow portion 5011h may have an inclination angle α4 non-perpendicular to a first interface 5301S1 (that is, an upper surface of the first chip body portion 5011 outside the first hollow portion 5011h). The first hollow portion 5011h may have a depth d11 in a direction perpendicular to the bottom surface 5011w2 and have a width d12 in a direction parallel to the bottom surface 5011w2.

The second protrusion 5021p may have a sidewall surface 5021w1 and a bottom surface 5021w2. The bottom surface 5021w2 of the second protrusion 5021p may be connected to a sidewall surface 5021e of the second chip body portion 5021. The sidewall surface 5021w1 of the second protrusion 5021p may have an inclination angle β2 non-perpendicular to a second interface 5301S2 that is a lower surface of the second chip body portion 5021 in contact with the nonconductive film 5301. The inclination angle β2 may be greater than 90° and less than 180°. The second protrusion 5021p may have a depth d13 in a direction perpendicular to the bottom surface 5021w2 and have a width d14 in a direction parallel to the bottom surface 5021w2.

Referring to FIG. 10B, the first and second semiconductor chips 5010 and 5020 may be bonded in substantially the same manner as described above with reference FIGS. 1 to 3, so that a nonconductive film 5301 may include a tail portion 5301T extending from a lateral edge portion of a bonding surface B-Z5 to the outside of the bonding zone B-Z5. Meanwhile, a portion of the nonconductive film 5301, adjacent to the first interface 5301S1 with the first semiconductor chip 5010 may be discharged more quickly to the outside of the bonding zone B-Z5 along the wider path by the first hollow portion 5011h, as compared to the portion adjacent to the first interface 300S1 of the nonconductive film 300 of the comparative example described above with reference to FIGS. 4A to 4C. In addition, a portion of the nonconductive film layer 5301, adjacent to a second interface 5302S2 with the second semiconductor chip 5020 may be slowly discharged to the outside of the bonding zone B-Z5 because the second protrusion 5021p serves as an obstacle, as compared with the portion adjacent to the second interface 300S2 of the nonconductive film layer 300 of the comparative example described above with reference to FIGS. 4A to 4C.

In an embodiment, the sidewall surface 5011w1 of the first hollow portion 5011h has an inclination angle α4 non-perpendicular to the first bonding surface 5301S1 and the sidewall surface 5021w1 of the second protrusion 5021p has an inclination β2 non-perpendicular to the second bonding surface 5302S2, so that the turbulence of the nonconductive film 5301 can be prevented from occurring in a region adjacent to the first hollow portion 5011h and a region adjacent to the second protrusion 5321p when the nonconductive film 5301 moves in the lateral direction due to the pressure applied by the bonding apparatus 30. As a result, the tail portion 5301T can be further controlled to be uniformly bent downward, based on the interface level L5 of the first interface 5301S1.

In an embodiment, the first to fourth semiconductor chips 5010, 5020, 5030 and 5040 may have substantially the same configurations. That is, each of the first to fourth semiconductor chips 5010, 5020, 5030 and 5040 may have first to fourth hollow portions 5011h, 5021h, 5031h and 5041h having the same configuration and first to fourth protrusions 5011*p*, 5021*p*, 5031*p* and 5041*p* having the same configuration on the upper and lower portions of each edge region, respectively.

In an embodiment, the sidewall surfaces of the first to fourth hollow portions 5011*h*, 5021*h*, 5031*h* and 5041*h* and the first to fourth protrusions 5011*p*, 5021*p*, 5031*p* and 5041*p* of the first to fourth semiconductor chips 5010, 5020, 5030 and 5040 each have an inclination angle non-perpendicular to the corresponding first to fourth semiconductor chips 5010, 5020, 5030 and 5040, so that bending of the tail portion of the nonconductive film between the first and second semiconductor chips 5010 and 5020, the tail portion of the nonconductive film between the second and third semiconductor chips 5020 and 5030, tail portion of the nonconductive film between the third and fourth semiconductor chips 5030 and 5040 can be controlled more effectively.

Meanwhile, although the semiconductor package 5000 in which four semiconductor chips 5010, 5020, 5030, and 5040 are stacked on the package substrate 1001 is described with reference to FIGS. 10A and 10B, the number of the stacked semiconductor chips is not necessarily limited to four, and other various numbers can be applied.

The embodiments have been disclosed above for illustrative purposes. Those of ordinary skill in the art will appreciate that various modifications, additions and substitutions are possible, without departing from the scope and spirit of the concepts as disclosed in the accompanying claims.

What is claimed is:

1. A semiconductor package comprising:
   a package substrate;
   a first semiconductor chip disposed on the package substrate and having a first through electrode;
   a second semiconductor chip stacked on the first semiconductor chip and having a second through electrode; and
   a nonconductive film disposed in a bonding zone between the first semiconductor chip and the second semiconductor chip,
   wherein at an edge portion of the bonding zone in a lateral direction, an edge portion of the first semiconductor chip is recessed in the lateral direction, based on an edge portion of the second semiconductor chip.

2. The semiconductor package of claim 1, wherein the nonconductive film further comprises a tail portion extending from the lateral edge of the bonding zone to an outside of the bonding zone, and
   wherein the tail portion is bent downward with reference to an interface level of the nonconductive film and the first semiconductor chip.

3. The semiconductor package of claim 2, wherein the tail portion is bent in the gravity direction.

4. The semiconductor package of claim 2, further comprising:
   a mold layer burying the first and second semiconductor chips and the nonconductive film over the package substrate.

5. The semiconductor package of claim 1, wherein the first semiconductor chip comprises a first bump electrically connected to the first through electrode and disposed in the bonding zone, and
   wherein the second semiconductor chip comprises a second bump electrically connected to the second through electrode and disposed in the bonding zone.

6. A semiconductor package comprising:
   a package substrate;
   a first semiconductor chip disposed on the package substrate and having a first through electrode;
   a second semiconductor chip stacked on the first semiconductor chip and having a second through electrode; and
   a nonconductive film disposed in a bonding zone between the first semiconductor chip and the second semiconductor chip,
   wherein in a lateral edge portion of the bonding zone, the first semiconductor chip has a hollow portion formed in an inner direction of the first semiconductor chip from a first bonding surface that is an upper surface of the first semiconductor chip in contact with the nonconductive film.

7. The semiconductor package of claim 6, wherein the nonconductive film further comprises a tail portion extending from the lateral edge of the bonding zone to an outside of the bonding zone, and
   wherein the tail portion is bent downward with reference to an interface level of the nonconductive film and the first semiconductor chip.

8. The semiconductor package of claim 7, further comprising:
   a mold layer burying the first and second semiconductor chips and the nonconductive film over the package substrate.

9. The semiconductor package of claim 6, wherein the hollow portion has a sidewall surface and a bottom surface, and
   wherein the sidewall surface of the hollow portion has an inclination angle substantially perpendicular to the first bonding surface.

10. The semiconductor package of claim 6, wherein the hollow portion has a sidewall surface and a bottom surface, and
    wherein the sidewall surface of the hollow portion has an inclination angle non-perpendicular to the first bonding surface.

11. The semiconductor package of claim 6, wherein in the lateral edge portion of the bonding zone, the second semiconductor chip further comprises a protrusion extending in an inner direction of the nonconductive film from a second bonding surface that is a lower surface of the second semiconductor chip in contact with the nonconductive film.

12. The semiconductor package of claim 11, wherein the protrusion has a sidewall surface and a bottom surface, and
    wherein the sidewall surface of the protrusion has an inclination angle perpendicular to the second bonding surface.

13. The semiconductor package of claim 11, wherein the protrusion has a sidewall surface and a bottom surface, and
    wherein the sidewall surface of the protrusion has an inclination angle non-perpendicular to the second bonding surface.

14. The semiconductor package of claim 6, wherein first semiconductor chip comprises a first bump electrically connected to the first through electrode and disposed in the bonding zone, and
    wherein the second semiconductor chip comprises a second bump electrically connected to the second through electrode and disposed in the bonding zone.

15. A semiconductor package comprising:
    a package substrate;
    semiconductor chips of the same type stacked on the package substrate to overlap each other; and
    a nonconductive film disposed in a bonding zone between the stacked semiconductor chips, wherein in a lateral edge portion of the bonding zone, each of the semiconductor chips has a hollow portion formed in an inner direction of the semiconductor chips from an upper surface of each of the semiconductor chips.

16. The semiconductor package of claim 15, wherein each of the semiconductor chips comprises:
   a through electrode; and
   a bump electrically connected to the through electrode.

17. The semiconductor package of claim 15, wherein the nonconductive film further comprises a tail portion extending from a lateral edge of the bonding zone to an outside of the bonding zone, and
   wherein the tail portion is bent downward with reference to an interface level of the nonconductive film and the first semiconductor chip.

18. The semiconductor package of claim 15, wherein the hollow portion has a sidewall surface and a bottom surface, and
   wherein the sidewall surface of the hollow portion has an inclination angle non-perpendicular to the upper surface of the semiconductor chip.

19. The semiconductor package of claim 15, wherein at least a portion of the semiconductor chip further comprises a protrusion extending to the bonding zone from a bottom surface of the semiconductor chip, in a lateral edge portion of the bonding zone.

20. The semiconductor package of claim 19, wherein the protrusion has a sidewall surface and a bottom surface, and
   wherein the sidewall surface of the protrusion has an inclination angle non-perpendicular to the bottom surface of the semiconductor chip.

\* \* \* \* \*